United States Patent
Tanaka et al.

(10) Patent No.: US 8,411,884 B2
(45) Date of Patent: Apr. 2, 2013

(54) AUDIO REPRODUCTION DEVICE AND AUDIO-VIDEO REPRODUCTION SYSTEM

(75) Inventors: Shoji Tanaka, Hyogo (JP); Ryo Ogasawara, Osaka (JP)

(73) Assignee: Panasonic Corporation, Osaka (JP)

( * ) Notice: Subject to any disclaimer, the term of this patent is extended or adjusted under 35 U.S.C. 154(b) by 211 days.

(21) Appl. No.: 12/867,128

(22) PCT Filed: Feb. 6, 2009

(86) PCT No.: PCT/JP2009/000463
§ 371 (c)(1),
(2), (4) Date: Aug. 11, 2010

(87) PCT Pub. No.: WO2009/101778
PCT Pub. Date: Aug. 20, 2009

(65) Prior Publication Data
US 2011/0080531 A1 Apr. 7, 2011

(30) Foreign Application Priority Data

Feb. 14, 2008 (JP) .................................. 2008-032847

(51) Int. Cl.
*H04R 5/02* (2006.01)
(52) U.S. Cl. ............ 381/306; 381/333; 381/98; 381/120
(58) Field of Classification Search .................... 381/27, 381/306, 333, 388, 98–99, 103, 120
See application file for complete search history.

(56) References Cited

U.S. PATENT DOCUMENTS
7,602,921 B2 10/2009 Iida et al.
8,180,074 B2 * 5/2012 Ko et al. ....................... 381/152
2004/0196991 A1 10/2004 Iida et al.
2008/0037805 A1 * 2/2008 Kino et al. .................... 381/101

FOREIGN PATENT DOCUMENTS
| EP | 1 848 110 | 10/2007 |
| JP | 3-128600 | 5/1991 |
| JP | 5-219597 | 8/1993 |
| JP | 2003-102099 | 4/2003 |

OTHER PUBLICATIONS

International Preliminary Report on Patentability issued Oct. 14, 2010 in International (PCT) Application No. PCT/JP2009/000463.
International Search Report issued May 19, 2009 in International (PCT) Application No. PCT/JP2009/000463.
J. Blauert, "Sound Localization in the Median Plane", ACUSTICA vol. 22, pp. 205-213, 1969/70.
Chinese Office Action (and partial English translation thereof) issued Dec. 5, 2012 in Chinese Application 200980105247.7.

* cited by examiner

*Primary Examiner* — Disler Paul
(74) *Attorney, Agent, or Firm* — Wenderoth, Lind & Ponack, L.L.P.

(57) ABSTRACT

An audio reproduction device and system are capable of realizing sounds having natural sound quality with no peculiarities, and provide an excellent audio-image ascending effect which is not varied due to differences among individual persons, thereby making audio images and images coincident with each other. A frequency characteristic correction portion forms a frequency characteristic such that a sound-pressure frequency characteristic of reproduced sound radiated to a viewing position from speakers has a first peak and a second peak, wherein the center frequency of the first peak falls within the range of 6 kHz±15%, and the center frequency of the second peak falls within the range of 13 kHz±20%.

8 Claims, 12 Drawing Sheets

AUDIO REPRODUCTION DEVICE AND AUDIO-VIDEO REPRODUCTION SYSTEM

BACKGROUND OF THE INVENTION

1. Technical Field

The present invention relates to an audio reproduction device for use with a video reproduction device, such as a television receiver, and to an audio-video reproduction system including the combination of an audio reproduction device and a video reproduction device and, particularly, relates to an audio reproduction device and an audio-video reproduction system which reproduce sounds in a stereo system or in a multi-channel system.

2. Background Art

In recent years, there have been increasingly users who enjoy so-called home theater in households, using audio reproduction devices constituted by amplifiers and speakers with excellent sound quality, in combination with thin-type large screen television receivers for reproducing clear images. Generally, television receivers have been used by being placed on furniture, such as television racks and tables with smaller heights (hereinafter, abbreviated as "low boards"). Therefore, the height of the center of a television screen is close to the height of a viewer's eye level. However, in many audio reproduction devices, the speakers for generating sounds are placed below the position of the center of the television screen.

There are many devices having placement states similar thereto, among audio reproduction devices incorporated in television receivers. For example, there are cases where, in order to cause a television receiver to have a smallest possible lateral width, the speakers are mounted thereto below the television screen.

In any of the aforementioned cases, sounds are heard from a different position from that of images, which has induced the problem that images and audio images are not coincident with each other and, therefore, the viewers have uncomfortable feelings. For example, in cases where the face of a speaking person appears on a television screen at the center thereof while the voices of this person are heard from below the television screen, the viewers have significantly uncomfortable feelings. Accordingly, by enabling ascent of audio images of reproduced sounds from speakers existing at lower positions, it is possible to overcome the aforementioned problem.

In order to overcome the aforementioned problem, there has been suggested, in JP-A No. 5-219597, an audio reproduction device which aims at ascending audio images of reproduced sounds from speakers placed below a television screen. This conventional audio reproduction device will be described, with reference to FIG. 21, FIG. 22, and FIG. 23.

FIG. 21 is a block diagram illustrating the structure of the conventional audio reproduction device disclosed in JP-A No. 5-219597. In the conventional audio reproduction device illustrated in FIG. 21, signals from an input signal source 44 are corrected in phase by a phase correction circuit 48, and the corrected signals are inputted to a mixing circuit 50 at its one terminal. Further, signal components centered at 7 kHz are extracted from the input signal source 44 by a filter circuit 43 and are amplified by a boost circuit 47 and, thereafter, these signals are controlled by a switch circuit 49b which are operated by signals from a random signal generator 49a and, then, are inputted to the other terminal of the mixing circuit 50. The mixing circuit 50 mixes the signals corrected in phase by the phase correction circuit 48 with the signals controlled by the switch circuit 49b and, further, outputs these signals resulted from the mixing to a speaker 41. The speaker 41 reproduces the signals resulted from the mixing.

Further, in cases where the boost circuit 47 and the like induce only extremely smaller phase shifts, it is possible to eliminate the phase correction circuit 48. The switch circuit 49b is provided in order to continuously change over signals, since ascent of audio images is felt most strongly at the time of changeover to boosted signals.

FIG. 22 is a sound-pressure frequency characteristic view illustrating ear's sensitivity to sounds reaching the viewer's ears from sound sources existing at a position at 30 degrees upwardly (+30 degrees) in the median plane and at a position at 30 degrees downwardly (−30 degrees) in the median plane, on the assumption that a state of 0 degree in the median plane is the case where the sound source is placed just in front of the viewer, namely the radiation axis (the center axis) of the speaker is horizontal and, also, the viewer's ears exist on this center axis. The term "30 degrees upwardly (+30 degrees) in the median plane" means the case where the sound source is placed on a line forming an angle of dip of 30 degrees in a vertically upward direction with respect to the horizontal line in the median plane. Further, the term "30 degrees downwardly (−30 degrees) in median plane" means the case where the sound source is placed on a lime forming an angle of dip of 30 degrees in a vertically downward direction with respect to the horizontal line in the median plane.

FIG. 23 is a sound-pressure frequency characteristic view resulted from the addition of a sound-pressure frequency characteristic indicating the ear sensitivity at 30 degrees upwardly in the median plane to the opposite characteristic resulted from upwardly and downwardly reversing, about an axis at 0 dB, the sound-pressure frequency characteristic indicating the ear sensitivity at 30 degrees downwardly (−30 degrees) in the median plane, which is illustrated in FIG. 22. In the sound-pressure frequency characteristic illustrated in FIG. 21, there is formed a single peak in a frequency range centered at 7 kHz.

In the conventional audio reproduction device illustrated in FIG. 21, based on the sound-pressure frequency characteristic illustrated in FIG. 23, the filter circuit 43 is caused to extract a frequency range centered at a frequency of 7 kHz, further, the extracted frequency range centered at a frequency of 7 kHz is boosted by the boost circuit 47, and the boosted frequency range is reproduced by the speaker 41. Further, in recent years, sound-pressure frequency characteristics indicative of ear sensitivities have been referred to as "head-related transfer functions" and, therefore, in the following description, the term "head-related transfer function" will be employed.

When the sound source exists at a position at 30 degrees downwardly (−30 degrees) in the median plane, signals having the opposite characteristics are formed by upwardly and downwardly reversing, about the axis at 0 dB, the head-related transfer function at 30 degrees downwardly in the median plane, and these signals are reproduced by the speaker 41, in order to correct the sounds, such that the sounds can be heard in a direction at 0 degree in the median plane (just in front of the viewer). Further, the head-related transfer function in a direction at 30 degrees upwardly (+30 degrees) in the median plane can be superimposed on the opposite characteristics, so that the sounds can be corrected such that the sounds are heard in the direction at 30 degrees upwardly (+30 degrees) in the median plane. Accordingly, it has been considered that, even when the speaker exists below the viewer's ears, it is possible to perform correction such that sounds can be heard as if the speakers existed above the viewer's ears.

Further, "J. BLAUERT "Sound Localization in the Median Plane", ACUSTICA Vol. 22, 205-213, 1969/70 (hereinafter, abbreviated as BLAUERT)" describes results of experiments indicating that sounds at about 8 kHz can cause humans to have feelings as if the sounds were heard from above their heads. Based on such a literature, there have been provided audio reproduction devices capable of ascending audio images from speakers for making audio images and images coincident with each other, by emphasizing sounds in a frequency range of 7 to 8 kHz, even when the speakers are placed below the center of the television screen.

Patent Literature 1: Japanese Unexamined Patent Publication JP-A No. 5-219597
Non-Patent Literature 1: J. BLAUERT "Sound Localization in the Median Plane", ACUSTICA Vol. 22, 205-213, 1969/70

SUMMARY OF THE INVENTION

However, with audio reproduction devices adapted to perform reproduction in such a way as to boost a frequency range centered at 7 kHz as described in JP-A No. 5-219597 and, also, with audio reproduction devices adapted to perform reproduction in such a way as to emphasize sounds in the frequency range from 7 to 8 kHz based on BLAUERT, there have been induced the problem of poor audio-image ascending effects and the problem that these effects are largely varied due to differences among individual persons. Further, in order to provide a necessary audio-image ascending effect, it has been necessary to largely emphasize sounds in the range of 7 to 8 kHz, which has induced the problem that the sound quality of reproduced sounds is largely changed and, thus, the sounds have unnatural sound quality with peculiarities. These problems will be described, in more detail, in the description of a first embodiment of the present invention.

The present invention was made in order to overcome the problems in conventional audio reproduction devices as described above and aims at providing an audio reproduction device and an audio-video reproduction system which are capable of realizing sounds having natural sound quality with no peculiarities and, further, are capable of providing an excellent audio-image ascending effect which is not varied due to differences among individual persons, thereby making audio images and images coincident with each other.

An audio reproduction device according to a first aspect of the present invention includes a speaker which radiate sound from below the center of a screen in a video reproduction device, an amplifier which drives the speaker, and a frequency characteristic correction portion which outputs, to the amplifier, a signal having a corrected frequency characteristic, wherein the frequency characteristic correction portion forms a frequency characteristic such that a sound-pressure frequency characteristic of reproduced sound radiated to a viewing position from the speaker has a first peak and a second peak, a center frequency of the first peak falls within the range of 6 kHz±15%, and a center frequency of the second peak falls within the range of 13 kHz±20%. With the audio reproduction device having this structure according to the first aspect, it is possible to correct audio characteristics with high accuracy in directions in the median plane, in such a way as to conform to an average head-related transfer function of actual people. Accordingly, with the audio reproduction device according to the first aspect, it is possible to provide an excellent audio-image ascending effect which is not varied due to differences among individual persons, thereby making audio images and images coincident with each other. Further, it is possible to eliminate the necessity of making the peak level extremely higher, thereby realizing sounds having natural sound quality with no peculiarities.

An audio reproduction device according to a second aspect of the present invention is the audio reproduction device according to the first aspect, wherein a level of the first peak falls within the range of from 3 dB to 12 dB, and a level of the second peak falls within the range of from 3 dB to 25 dB. With the audio reproduction device having this structure according to the second aspect, it is possible to reduce the variation of the sound quality, which enables realization of sounds having more natural sound quality with less peculiarities.

An audio reproduction device according to a third aspect of the present invention is the audio reproduction device according to the first aspect or the second aspect, wherein the first peak or the second peak is formed by utilizing a sound-pressure frequency characteristic of the speaker itself. With the audio reproduction device having this structure according to the third aspect, it is possible to simplify the structure of the frequency characteristic correction portion, thereby enabling reduction of the increase of the cost of the audio reproduction device.

An audio reproduction device according to a fourth aspect of the present invention is the audio reproduction device according to the first aspect or the second aspect, wherein the sound-pressure frequency characteristic of reproduced sound radiated from the speaker has a characteristic curve having a dip formed to have a center frequency of 8 kHz±10%. With the audio reproduction device having this structure according to the fourth aspect, it is possible to correct audio characteristics with higher accuracy in directions in the median plane in such a way as to conform to the head-related transfer function, thereby further making audio images and images coincident with each other.

An audio reproduction device according to a fifth aspect of the present invention is the audio reproduction device according to the fourth aspect, wherein the dip is formed by utilizing a sound-pressure frequency characteristic of the speaker itself. With the audio reproduction device having this structure according to the fifth aspect, it is possible to simplify the structure of the frequency characteristic correction portion, thereby enabling reduction of the increase of the cost of the audio reproduction device.

An audio reproduction device according to a sixth aspect of the present invention is the audio reproduction device according to anyone of the first to fifth aspects, wherein the audio reproduction device is adapted such that the level or the Q value of the first peak or the second peak can be adjusted. With the audio reproduction device having this structure according to the sixth aspect, it is possible to freely adjust the balance between the audio-image ascending effect and the sound naturalness. Further, with the audio reproduction device having this structure according to the sixth aspect, it is possible to freely adjust the audio-image ascending effect, according to a place where the speaker is installed.

An audio reproduction device according to a seventh aspect of the present invention is the audio reproduction device according to any one of the first to fifth aspects, wherein the frequency characteristic correction portion is structured to boost, by a predetermined level, a level in a higher-frequency range, in the sound-pressure frequency characteristic of reproduced sound radiated to the viewing position from the speaker. With the audio reproduction device having this structure according to the seventh aspect, it is possible to freely adjust the balance between the audio-image ascending effect and the sound naturalness. Further, it is possible to eliminate attenuation phenomena in higher-frequency ranges, which would be induced in cases of certain speakers, such as, speakers covered at their front surfaces with punched nets or laterally-longer elliptical speaker.

An audio-video reproduction system according to an eighth aspect of the present invention is formed from the combination of the audio reproduction device according to any one of the first to seventh aspects and a video reproduction device capable of reproducing images. With the audio-video reproduction device having this structure according to the eighth aspect, it is possible to allow images to be enjoyed with sounds having natural sound quality with less peculiarities which are not varied due to differences among individual persons, such that audio images and images are coincident with each other.

According to the present invention, it is possible to provide an audio reproduction device and an audio-video reproduction system which are capable of realizing sounds having natural sound quality with no peculiarities and, also, are capable of providing an excellent audio-image ascending effect which is not varied due to differences among individual persons, thereby making audio images and images coincident with each other.

DETAILED DESCRIPTION OF THE INVENTION

Hereinafter, preferred embodiments for carrying out the audio reproduction devices according to the present invention will be described in detail, with reference to the accompanying drawings. In the following embodiments, there will be described cases where the audio reproduction devices according to the present invention are used by being combined with a television receiver having a thin-type large screen, as a video reproduction device, for forming an audio-video reproduction system. However, structures of the following embodiments are merely illustrative, and the structures of these embodiments are not intended to restrict the present invention, and the present invention is intended to cover structures based on the same technical concepts.

First Embodiment

Figure 1:
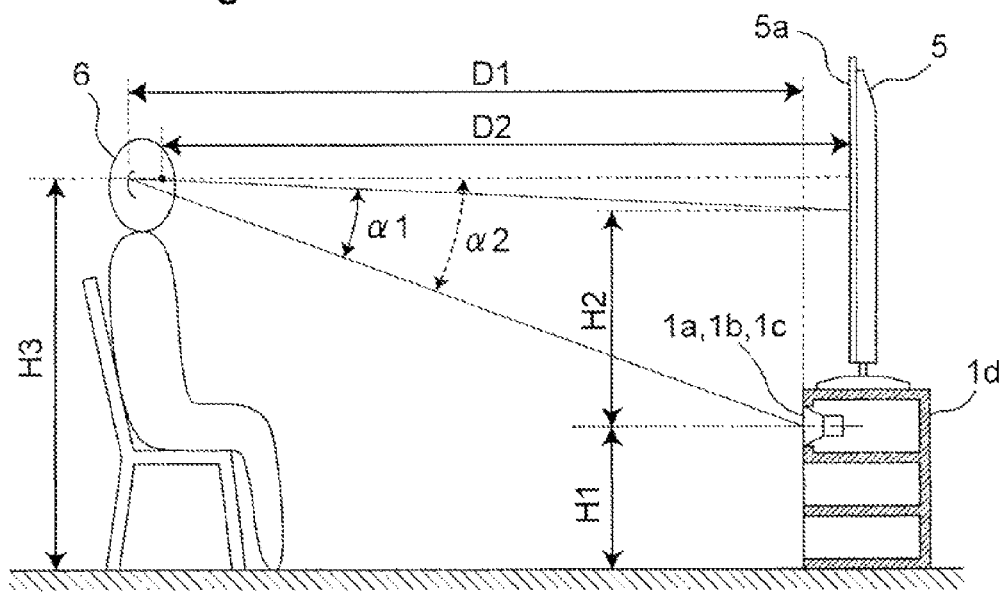
FIG. 1 is a view illustrating the positional relationship between a viewer and an audio-video reproduction system including an audio reproduction device according to a first embodiment of the present invention.
Figure 2:
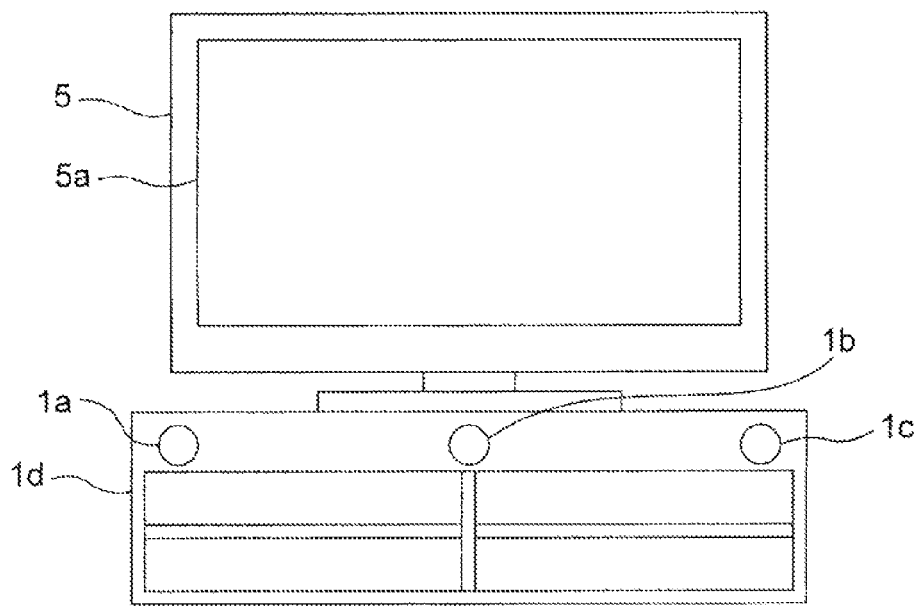
FIG. 2 is a front view, of a structure of the audio reproduction device according to the first embodiment of the present invention.
Figure 3:
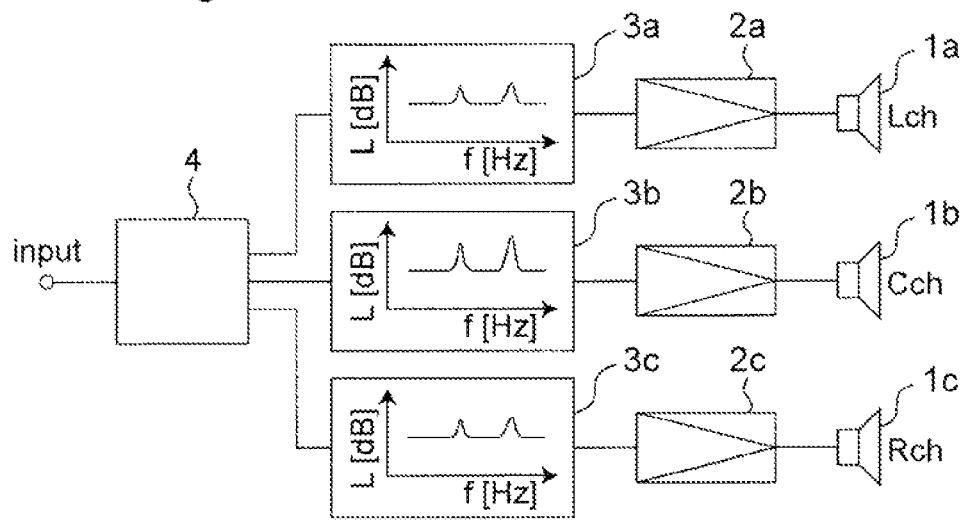
FIG. 3 is a block diagram illustrating a structure of the audio reproduction device according to the first embodiment of the present invention.
Figure 4:
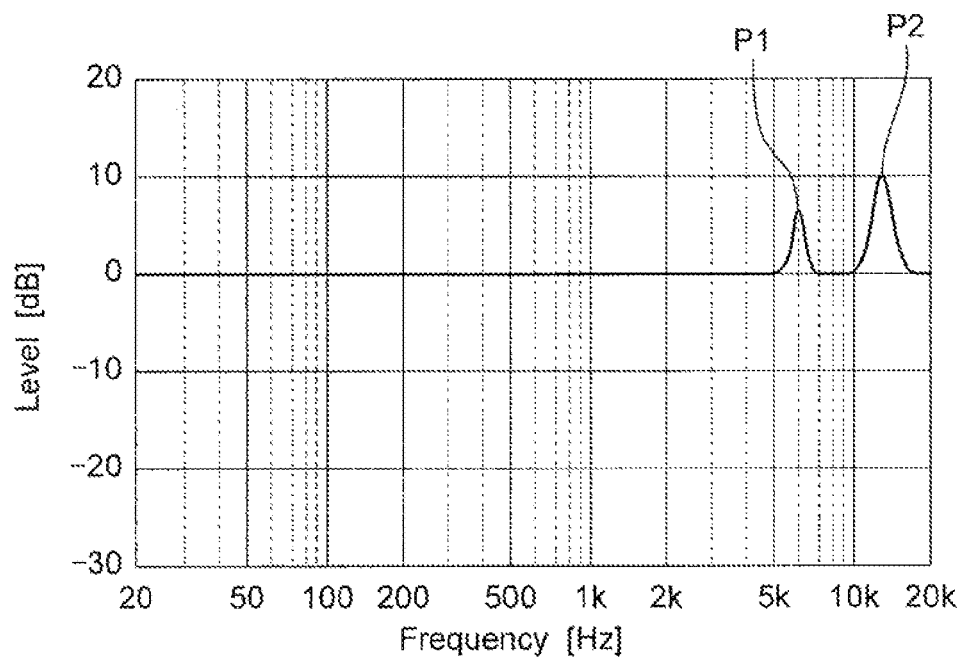
FIG. 4 is a frequency characteristic view about a frequency characteristic correction portion for a center channel in the audio reproduction device according to the first embodiment of the present invention.
Figure 5:
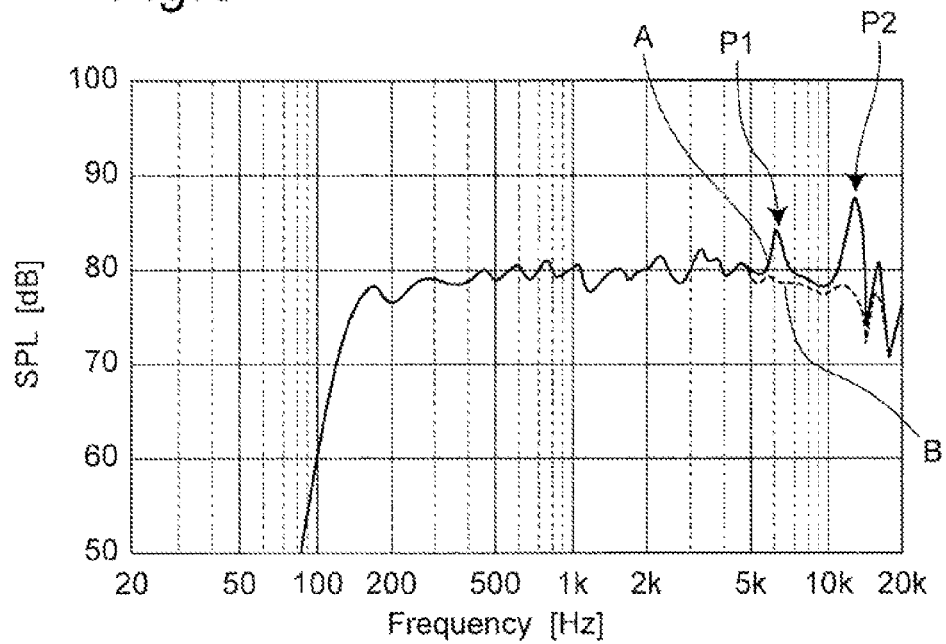
FIG. 5 is a sound-pressure frequency characteristic view at 20 degrees upwardly in the median plane (+20 degrees) with respect to the radiation axis of a speaker for the center channel in the audio reproduction device according to the first embodiment of the present invention.

There will be described the structure of an audio reproduction device according to a first embodiment of the present invention, with reference to FIG. 1 to FIG. 5. FIG. 1 is a side view illustrating the structure of an audio-video reproduction system including the audio reproduction device according to the first embodiment, illustrating a positional relationship with a viewer, in a case where the audio reproduction device according to the first embodiment is used in combination with a television receiver having a thin-type large screen, as a video reproduction device. FIG. 2 is a front view of the audio-video reproduction system employing the audio reproduction device according to the first embodiment in combination with the video reproduction device, and FIG. 3 is a block diagram illustrating an internal structure of the audio reproduction device according to the first embodiment. FIG. 4 and FIG. 5 exemplify frequency characteristic views of the audio reproduction device according to the first embodiment.

As illustrated in FIG. 1, in the audio-video reproduction system employing the audio reproduction device according to the first embodiment in combination with the video reproduction device, there is placed, on a rack 1d, a video reproduction device 5 as a television receiver having a thin-type large screen, such as a so-called plasma television or a liquid crystal television. Three speakers 1a, 1b, and 1c are placed inside the rack 1d, on which the video reproduction device 5 is placed. Accordingly, the respective speakers 1a, 1b, and 1c are placed under the screen 5a of the video reproduction device 5 and are structured to radiate sounds from below the screen 5a.

As illustrated in FIG. 2, the three speakers provided within the rack 1d are a speaker 1a for a front L channel which is placed in the left side of the rack 1d, a speaker 1b for a center channel which is placed at the center of the rack 1d, and a speaker is for a front R channel which is placed in the right side of the rack 1d. Accordingly, there is a structure which causes the speaker 1a for the front L channel to radiate sounds from below the screen 5a in the left side thereof, further causes the speaker 1b for the center channel to radiate sounds from below the screen 5a at the center thereof and further causes the speaker is for the front R channel to radiate sounds from below the screen 5a in the right side thereof. The respective speakers 1a, 1b, and 1c are all full range units having the same aperture of 6.5 cm.

As illustrated in the block diagram of the audio reproduction device in FIG. 3, the speakers 1a, 1b, and is are driven by a front-L-channel amplifier 2a, a center-channel amplifier 2b, and a front-R-channel amplifier 2c, respectively. In the audio reproduction device according to the first embodiment, each of the amplifiers 2a, 2b, and 2c outputs 50 W.

A frequency characteristic correction portion 3a for the front L channel, a frequency characteristic correction portion 3b for the center channel, and a frequency characteristic correction portion 3c for the front R channel are connected to the amplifiers 2a, 2b, and 2c, respectively, in the stages previous thereto. These frequency characteristic correction portions 3a, 3b, and 3c are digital filter circuits using respective DSPs (Digital Signal Processors). Signals inputted from a source are decoded into signals for the respective channels by a signal output device 4, and the decoded signals are inputted to the respective frequency characteristic Correction portions 3a, 3b, and 3c. The respective frequency characteristic correction portions 3a, 3b, and 3c correct and change frequency characteristics and output desired signals to the speakers 1a, 1b, and 1c, respectively, as will be described later. In the audio reproduction device according to the first embodiment, each frequency characteristic correction portion 3a, 3b, 3c is constituted by an equalizer for correcting and changing frequency characteristics.

In the audio-video reproduction system employing the audio reproduction device according to the first embodiment illustrated in FIG. 1, a height H1 of the radiation axis (the center axis) of each speaker 1a, 1b, is from a floor surface is about 37 cm. The rack 1d has a height of about 45 cm, which is slightly lower than those of furniture such as chests. A height H2 is the height of the center of the screen 5a in the audio reproduction device 5 from the center axis of each speaker 1a, 1b, 1c. Accordingly, the height of the center of the screen 5a in the audio reproduction device 5 from the floor surface is H1+H2.

A height H3 is the height of the eyes and the ears of a viewer 6 from the floor surface. Generally, the height from the floor surface to the eyes is substantially the same as the height from the floor surface to the ears. "D1" is a horizontal distance from the edge of each speaker 1a, 1b, 1c to the ears of the viewer 6, and "D2" is a horizontal distance from the screen 5a in the video reproduction device 5 to the eyes of the viewer 6, namely the viewing distance. The distance D1 to the speakers 1a, 1b, and 1c and the distance D2 to the screen 5a are substantially the same distance.

In FIG. 1, α1 is the angle of dip between the line connecting the position of the ears of the viewer 6 to the center position of each speaker 1a, 1b, 1c and the line connecting the position of the eyes (or the ears) of the viewer 6 to the center position of the screen 5a in the video reproduction device 5. α2 is the angle of dip between the line connecting the position of the ears of the viewer 6 to the center position of each speaker 1a, 1b, 1c and the horizontal line at the position of the ears of the viewer 6.

The height H1+H2 of the center of the screen 5a in the video reproduction device 5 from the floor surface has a value close to that of the height H3 of the eyes and the ears of the viewer 6 from the floor surface. In respective households, when the television receiver is viewed by being placed on a rack or a low board, the screen 5a is usually adjusted such that its center is close to the height of the eyes. Accordingly, the two angles α1 and α2 of dip have substantially the same value.

TABLE 1

| Screen Sizes | H2 | H1 + H2 | Angles α1 of Dip [deg] for respective screen sizes and viewing distances D2 [mm] | | | | | | |
|---|---|---|---|---|---|---|---|---|---|
| [inch] | [mm] | [mm] | D2 = 1000 | D2 = 1160 | D2 = 1320 | D2 = 1570 | D2 = 1820 | D2 = 2030 | D2 = 2500 |
| 65 | 663 | 1033 | | | | | | *22.4* | 14.9 |
| 58 | 627 | 997 | | | | | *23.4* | 21.1 | 14.1 |
| 50 | 568 | 938 | | | | *24.0* | 21.1 | 19.0 | 12.7 |
| 42 | 510 | 880 | | | *24.5* | 21.3 | 18.8 | 17.0 | 11.4 |
| 37 | 480 | 850 | | *25.2* | 22.9 | 19.9 | 17.6 | 15.9 | 10.7 |
| 32 | 445 | 815 | *25.4* | 23.1 | 21.1 | 18.4 | 16.3 | 14.7 | 9.9 |

Table 1 is an at-a-glance chart illustrating the angle α1 of dip[deg], incases of varying the viewing distance D2[mm] in association with various screen sizes in the video reproduction device in the audio-video reproduction system employing the audio reproduction device according to the first embodiment illustrated in FIG. 1. In Table 1, thick italics designate maximum values of the angle α1 of dip, in the case where the respective viewing distances D2 are set to minimum viewing distances for the various screen sizes. These respective viewing distances D2 are minimum distances which enable high-definition images on the high-quality televisions to be viewed. In general, such minimum distances are distances which are twice the longitudinal sizes of screen sizes.

As can be seen from Table 1, the angle α of dip is only about 25 degrees even at a maximum, and in cases of viewing distances of about 1.5 m to 3 m for general television receivers in ordinary households, the angle α of dip falls within the range of 15 degrees to 20 degrees.

Accordingly, in the audio reproduction device according to the first embodiment, the targeted angle of ascent of audio images from each speaker 1a, 1b, 1c placed below the television screen is set to about 20 degrees, in conformance to the aforementioned situations of usage in actual ordinary households. Namely, the angle α1 of dip is substantially the same angle as the angle α2 of dip and, therefore, the audio reproduction device according to the first embodiment is structured such that audio images from a sound source at an angle of dip of 20 degrees downwardly (−20 degrees) in the median plane is ascended to a position just in front of the viewer 6. Hereinafter, there will be described, in detail, a method for ascending audio images from the sound source.

FIG. 4 is a frequency characteristic view of the frequency characteristic correction portion 3b for the center channel, in the audio reproduction device according to the first embodiment. FIG. 5 is a sound-pressure frequency characteristic view of reproduced sounds at 20 degrees in a vertically upward direction with respect to the radiation axis (the center axis) of the speaker 1b for the center channel, in the audio reproduction device according to the first embodiment. In FIG. 5, a solid line A represents a case where the frequency characteristic correction portion 3b in the audio reproduction device according to the first embodiment functions, while a broken line B represents a case where the frequency characteristic correction portion 3b is not provided in the audio reproduction device according to the first embodiment.

As illustrated in FIG. 4, the curve of the frequency characteristic of the frequency characteristic correction portion 3b for the center channel has two peaks, which area first peak P1 and a second peak P2. The first peak P1 has a center frequency of 6 kHz, a level of 6 dB, and a Q value of 7. Further, the second peak P2 has a center frequency of 13 kHz, a level of 10 dB, and a Q value of 4. In this case, the Q value is defined according to the following equation (1), in general.

$$Q=\omega 0/(\omega 2-\omega 1) \quad (1)$$

In the equation (1), "ω0" is the frequency at the peak, "ω1" is the frequency at which the value of the vibration energy (the level) becomes half that of the peak at the left of the peak, and "ω2" is the frequency at which the value of the vibration energy (the level) becomes half that of the peak at the right of the peak. A lager Q value indicates a sharper peak having a smaller wave width, and on the contrary, a smaller Q value indicates a milder peak having a larger wave width.

In the frequency characteristic of the frequency characteristic correction portion 3a for the front L channel and the frequency characteristic of the frequency characteristic correction portion 3c for the front R channel, the frequency of the first peak P1 and the frequency and the Q value of the second peak P2 are the same as those in the frequency characteristic of the frequency characteristic correction portion 3b for the center channel. However, the frequency characteristic correction portion 3a and the frequency characteristic correction portion 3c are adapted such that a level of the first peak P1 is 4 dB, and a level of the second peak P2 is 7 dB, and these levels are slightly smaller than those in the frequency characteristic correction portion 3b for the center channel.

Referring to FIG. 5, as can be seen from the solid line A illustrating the sound-pressure frequency characteristic at 20 degrees in the vertically upward direction with respect to the center axis of the speaker 1b for the center channel and from the broken line 3 illustrating the sound-pressure frequency characteristic of the case where the frequency characteristic correction portion is not provided, the sound-pressure frequency characteristic curve of the solid line A has a peak of about 6 dB at 6 kHz and a peak of about 8 dB at 13 kHz. Further, the present inventors conducted experiments which revealed that there were observed a peak of about 4 dB at 6 kHz and a peak of about 5 dB at 13 kHz, in a curve of the sound-pressure frequency characteristic at 20 degrees in the vertically upward direction with respect to the center axis of the speaker 1a for the front L channel and, also, in a curve of the sound-pressure frequency characteristic at 20 degrees in the vertically upward direction with respect to the center axis of the speaker 1c for the R channel.

Next, there will be described, in detail, the principle, effects, and advantages of the audio reproduction device having the aforementioned structure according to the first embodiment, with reference to the accompanying FIGS. 6 to 13. Along therewith, there will be described, in detail, problems of conventional audio reproduction devices.

Figure 6:
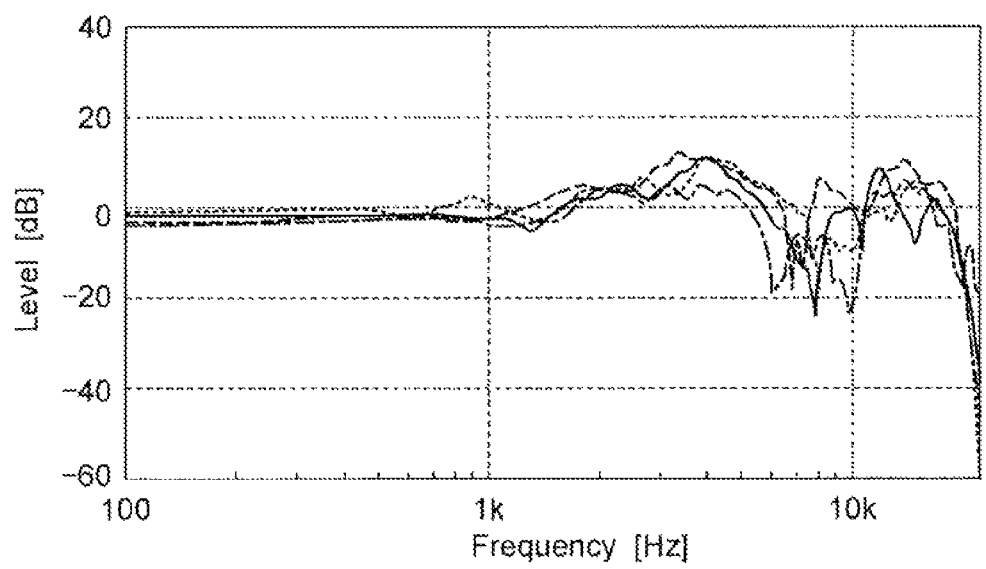
FIG. 6 is a frequency characteristic view of a head-related transfer function with respect to a sound source in a direction at 0 degree in the median plane.
Figure 7:
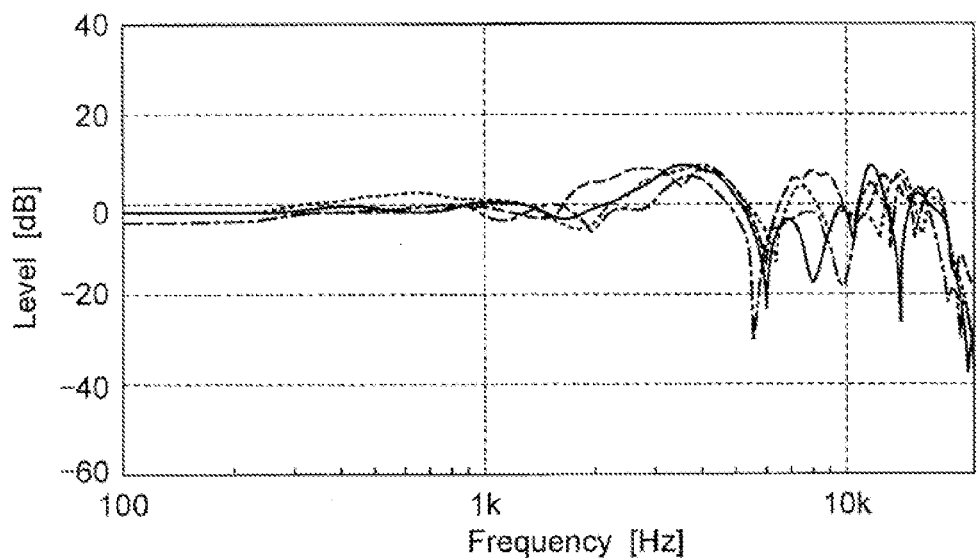
FIG. 7 is a frequency characteristic view of a head-related transfer function with respect to a sound source in a direction at about 20 degrees downwardly (−22.5 degrees) in the median plane.

FIG. 6 is a frequency characteristic view of the head-related transfer function of a viewer with respect to a sound source, in a case where the viewer exists in a direction at 0 degree in the median plane (in a direction just in front of the sound source). FIG. 7 is a frequency characteristic view of the head-related transfer function of a viewer with respect to a sound source which is in a direction at about 20 degrees downwardly (−22.5 degrees) in the median plane. The frequency characteristic curves illustrated in FIG. 6 and FIG. 7, which are based on the results of recent researches about head-related transfer functions, were drawn by superimposing, on one another, the frequency characteristics of head-related transfer functions of representative average four persons, out of detailed data of frequency characteristics of head-related transfer functions of several tens of tested persons (Copyright (c) 2001 The Regents of the University of California. All Rights Reserved).

Figure 8:
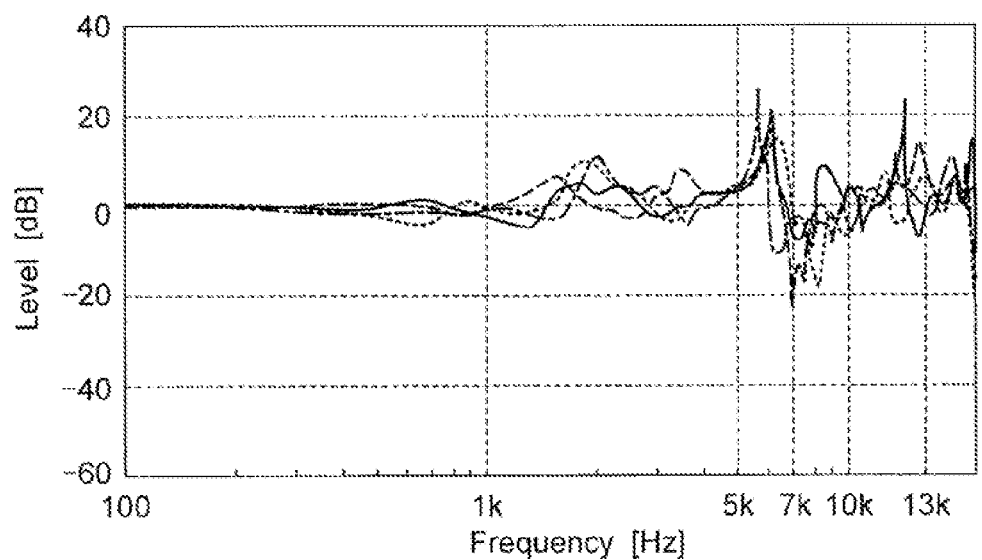
FIG. 8 is a frequency characteristic view resulted from the subtraction of the head-related transfer function with respect to the sound source in a direction at about 20 degrees downwardly (−22.5 degrees) in the median plane from the head-related transfer function with respect to the sound source in the direction at 0 degree in the median plane.

The present inventors have found notable characteristics, by performing calculations for a frequency characteristic curve illustrated in FIG. 8, based on the frequency characteristic curves illustrated in FIG. 6 and FIG. 7. FIG. 8 is a frequency characteristic view resulted from the subtraction of the head-related transfer function with respect to the sound source in the direction at about 20 degrees downwardly (−22.5 degrees) in the median plane, which is illustrated in FIG. 7, from the head-related transfer function with respect to the sound source in the direction at 0 degree in the median plane, which is illustrated in FIG. 6. Namely, it can be understood that audio images from the sound source can be ascended by about 20 degrees (22.5 degrees), by adding the frequency characteristic illustrated in FIG. 8 to the head-related transfer function with respect to the sound source in the direction at about 20 degrees downwardly (−22.5 degrees) in the median plane.

As illustrated in the frequency characteristic view of FIG. 8, each of the frequency characteristics has particularly higher levels around a frequency of 6 kHz and around a frequency of 13 kHz. Based on these results, in the audio reproduction device according to the first embodiment of the present invention, a first peak is provided to have a center frequency of 6 kHz and a second peak is provided to have a center frequency of 13 kHz, in the sound-pressure frequency characteristic of each speaker 1a, 1b, 1c, such that audio images at the position of the television screen reach the ears of the viewer, with respect to the viewer 6 existing at a position at 20 degrees in the vertically upward direction with respect to the center axis of each speaker 1a, 1b, 1c.

As described above, the audio reproduction device according to the first embodiment is structured, such that two peaks are formed in the sound-pressure frequency characteristic of reproduced sounds from each speaker 1a, 1b, 1c. In the audio reproduction device according to the first embodiment, the sound-pressure frequency characteristic of reproduced sounds from each speaker 1a, 1b, 1c existing below the television screen is corrected, such that this sound-pressure frequency characteristic is close to the sound-pressure frequency characteristic of reproduced sounds in the case where the reproduced sounds reach the ears of the viewer 6 in a direction from the television screen which is just in front of the viewer 6. Thus, with the audio-video reproduction system employing the audio reproduction device according to the first embodiment, it is possible to cause the viewer 6 to feel as if reproduced sounds from each speaker 1a, 1b, 1c reached him or her in a direction just facing to the viewer 6, namely from the television screen.

As described in the aforementioned section of the background tourniquets, conventional audio reproduction devices have been adapted to make attempts to perform reproduction in such a way as to boost only sounds with a single frequency within the range of 7 to 8 kHz for ascending audio images. However, such conventional audio reproduction devices have had the problem of their poor effects of ascending audio images and the problem that these effects largely vary due to differences among individual persons. The present inventors have found, from experiments, that the problems can be overcome by providing peaks in two certain frequency ranges, in the frequency characteristic of reproduced sounds from audio reproduction devices as described above. Based on this finding, the audio reproduction device according to the first embodiment of the present invention is structured such that the frequency characteristic of reproduced sounds from the audio reproduction device has two peaks at certain frequencies, in order to certainly ascend the position of audio images.

As described above, in conventional audio reproduction devices, center frequencies for correction have been set to 7 to 8 kHz, based on old data about head-related transfer functions. Accordingly, the correction frequencies have been deviated from actual head-related transfer functions of average persons. This is considered to be one cause of poor audio-image ascending effects and of large variations in these effects due to differences among individual persons. The audio reproduction device according to the first embodiment of the present invention is structured based on the results of experiments which were conducted using recent accurate data, as data about head-related transfer functions in median planes. Accordingly, the audio reproduction device according to the first embodiment of the present invention is formed to be a device having higher reliability which is capable of certainly ascending the position of audio images.

In the audio reproduction device according to the first embodiment of the present invention, the targeted angle for correction of the head-related transfer function, namely the angle $\alpha$ of dip, is set to be a relatively smaller angle in conformance to usage situations, such as about 20 degrees (22.5 degrees), rather than being set to be immoderately large, such as 30 to 45 degrees, as in conventional audio reproduction devices.

Figure 9:
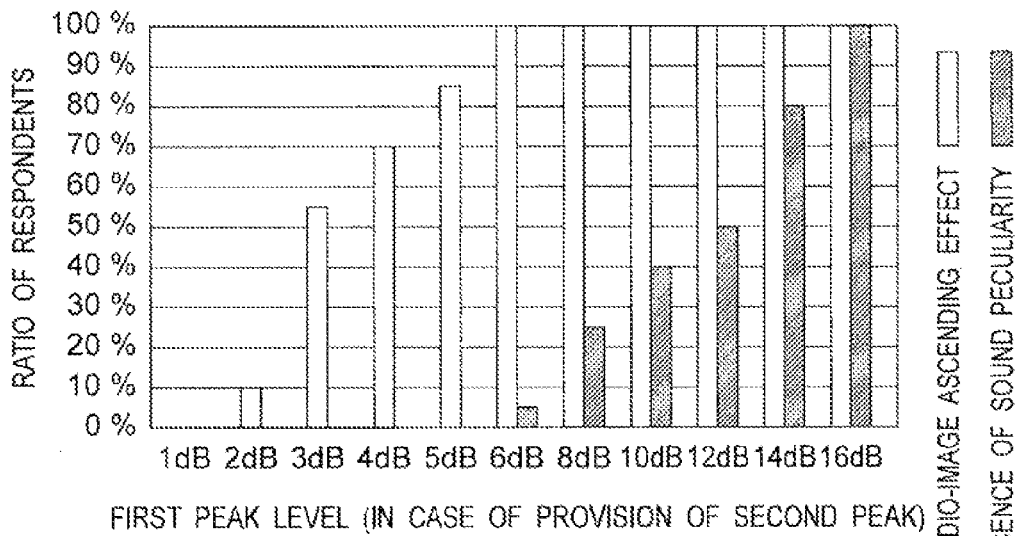
FIG. 9 is a graph of results of experiments about viewing illustrating an effect of the audio reproduction device according to the first embodiment of the present invention.
Figure 10:
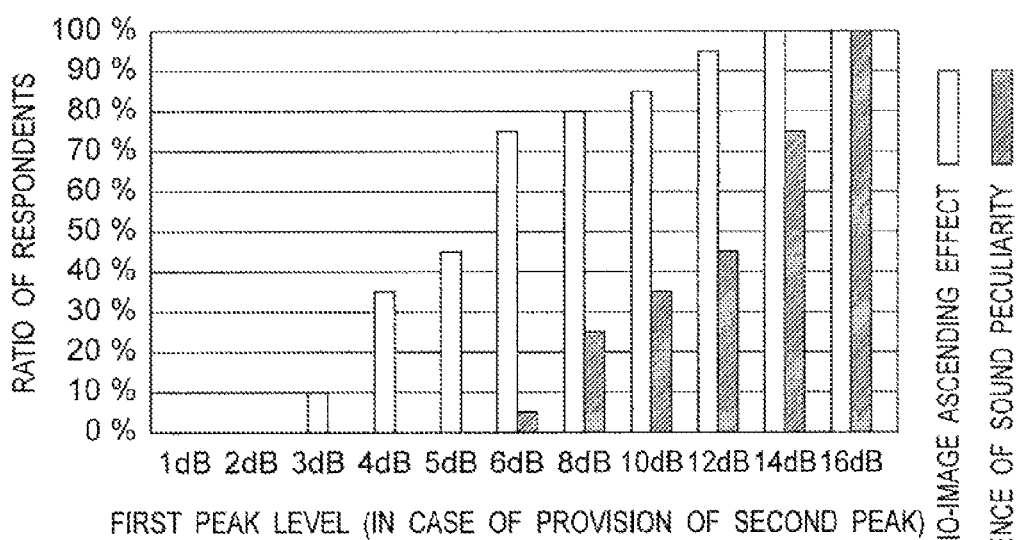
FIG. 10 is a graph of results of experiments about viewing illustrating an effect of the audio reproduction device according to the first embodiment of the present invention.

In the audio reproduction device according to the first embodiment of the present invention, two peaks are formed in the frequency characteristic of reproduced sounds from the speakers, unlike in conventional audio reproduction devices. It has been verified that, by forming two peaks in reproduced sounds as described above, it is possible to realize sounds having natural sound quality with no peculiarity, while providing an excellent audio-image ascending effect. This effect will be described with reference to FIG. 9 and FIG. 10. FIG. 9 and FIG. 10 are graphs illustrating the results of experiments about viewing which were conducted with respect to viewers, in order to verify the effects of the audio reproduction device according to the first embodiment of the present invention.

These experiments about viewing were conducted, at a state where a video reproduction device 5 as a television receiver with a thin-type large screen was placed on the audio reproduction device according to the first embodiment, and a viewer 6 as a tested person sat just in front of the screen 5a thereof, as illustrated in FIG. 1 and FIG. 2. In the experiments about viewing, the tested person performed evaluations as to whether or not there was an audio-image ascending effect and, also, as to whether or not he or she was aware of peculiarities in sounds, by changing over between a case where the audio reproduction device had a frequency characteristic correction portion and a case where it had no frequency characteristic correction portion, while viewing and listening both images and lines and singing voices in news, movies and the like.

Referring to FIG. 9, in the experiments about viewing, the sound-pressure frequency characteristic of reproduced sounds from the audio reproduction device had a second peak P2 having a center frequency of 13 kHz and a fixed level of 8 dB, while the level of the first peak P1 was varied, in order to extract a preferable level of the first peak P1.

Referring to FIG. 10, in the experiments about viewing, the sound-pressure frequency characteristic of reproduced sounds from the audio reproduction device had no second peak P2, while the first peak P1 was varied, in order to extract a preferable level of the first peak P1. In these experiments about viewing, the tested persons were a total of 20 persons constituted by males and females who are 20 to 50 years old having normal hearing abilities, and they were distributed without being concentrated in certain age groups.

As can be clearly seen from FIG. 9 and FIG. 10, the obtained results of the experiments indicate that, as the level of the first peak P1 in the sound-pressure frequency characteristic of reproduced sounds was increased, the audio-image ascending effect was increased, but a larger number of persons answered that the sounds had peculiarities and were unnatural.

Further, as can be understood from FIG. 10, in the case where there was no second peak P2, when the level of the first peak P1 was set to 12 dB, most of the persons, namely 90% or more of the persons, answered that they felt an audio-image ascending effect, but almost half of the persons answered that they were aware of peculiarities of sounds. On the contrary, when the peak level of the first peak P1 was set to 5 dB, no person answered that there were peculiarities of sounds, but only half of the persons answered that there was an audio-image ascending effect.

On the other hand, as illustrated in FIG. 9, when a first peak P1 and a second peak P2 were both formed in the frequency characteristic of reproduced sounds, even in the case where the level of the first peak P1 was 5 dB, most of the persons, namely 80% of the persons, answered that there was an audio-image ascending effect, and no person answered that there were peculiarities in sounds. Further, when the level of the first peak P1 was set to 6 dB, namely when it was set to a peak level which is set in the audio reproduction device according to the first embodiment, all the persons answered that there was an audio-image ascending effect, and there were hardly persons who answered that there were peculiarities in sounds.

As described above, by forming both a first peak P1 and a second peak P2 in the frequency characteristic of reproduced sounds, it is possible to provide an excellent audio-image ascending effect which is not varied due to differences among individual persons, without increasing peculiarities of sounds. Thus, it is possible to largely improve the audio-image ascending effect. Accordingly, it has been revealed that, by forming two peaks in the frequency characteristic of reproduced sounds as described above, it is possible to make audio images and images coincident with each other and, also, it is possible to realize sounds having natural sound quality with no peculiarities.

One reason why the formation of a second peak P2 in addition to a first peak P1 can offer the aforementioned improvement is that it is possible to correct the audio characteristic more accurately than in cases of providing only a first peak P1, such that audio images are in the direction just facing to the viewer in conformance with an average head-related transfer function of actual persons.

Further, another significant reason why the formation of a second peak P2 in addition to a first peak P1 can offer the aforementioned improvement is that the center frequency of the second peak P2 is set to about 13 kHz. In cases of sounds with such significantly high frequencies, audio image localization for these sounds themselves is ambiguous and, therefore, by emphasizing high-pitched sounds at the second peak P2, it is possible to provide the effect of making detection of the positions of audio images from the speakers ambiguous. For example, it has been well known that, regarding significantly-high-pitched sounds with a frequency of 15.7 kHz generated from a horizontal oscillation transformer in a Braun tube television receiver, which are heard as keening sounds, it is hard to understand where these sounds are being generated. The second peak P2 has a center frequency of about 13 kHz, which is a high frequency to which human's ears have lower sensitivity. Therefore, the second peak P2 has a characteristic that, even if its peak level is made higher, peculiarities in sounds can not be easily felt.

It is known that older people have lower audible limit frequencies in higher-tone ranges. For example, people in 20-year-old have upper limit audible frequencies of about 20 kHz, while people in 50-year-old can hardly hear higher-pitched sounds with a frequency of 20 kHz and can easily hear only frequencies of up to about 16 kHz. Accordingly, high-pitched sounds having a frequency of 13 kHz, which corresponds to the frequency at the second peak P2, are close to the upper limit audible frequencies for middle-aged people and, thus, fall within a range within which sound peculiarities are not felt even if the peak level is significantly increased therein.

As described above, in conventional audio reproduction devices, the frequency of the first peak P1 has been deviated from the frequency of an average head-related transfer function of actual people, which has induced the problem that the audio-image ascending effect largely varies due to differences among individual persons. Further, conventional audio reproduction devices have had only a single peak, which has made it necessary to largely increase the level of the single peak, in order to provide a certain degree of an audio-image ascending effect. As a result, conventional audio reproduction devices have induced significantly-large sound peculiarities, which has made it impossible to attain both ascending of audio images and natural sound quality with no peculiarities.

For example, regarding a conventional audio reproduction device, actual experiments about viewing were conducted by setting the level of a first peak P1 in the sound-pressure frequency characteristic of reproduced sounds at about 20 dB. As a result, the sounds had strong peculiarities, which was impractical.

Regarding the audio reproduction device according to the first embodiment, the aforementioned experiments about viewing were conducted, with respect to the levels of the first peak P1 and the second peak P2 in the sound-pressure frequency characteristic of reproduced sounds, in order to investigate a preferable practical frequency range. As a result, as illustrated in FIG. 9, the level of the first peak P1 was required to be a level equal to or higher than 3 dB, in order to cause more than half of the persons to feel the effect. Further, the level of the first peak P1 was required to be a level equal to or lower than 12 dB, in order to cause only half or less of the persons to feel that sounds had peculiarities and were unnatural.

Regarding the level of the second peak P2 in the sound-pressure frequency characteristic of reproduced sounds, only when it was set to be equal to or higher than 3 dB, there was observed an improvement of the audio-image ascending effect provided by the provision of the second peak P2. Further, when its peak level was higher than 25 dB, a larger number of persons felt that sounds had peculiarities and were unnatural, which was not preferable. The level of the second peak P2 will be described, with reference to FIG. 11.

Figure 11:
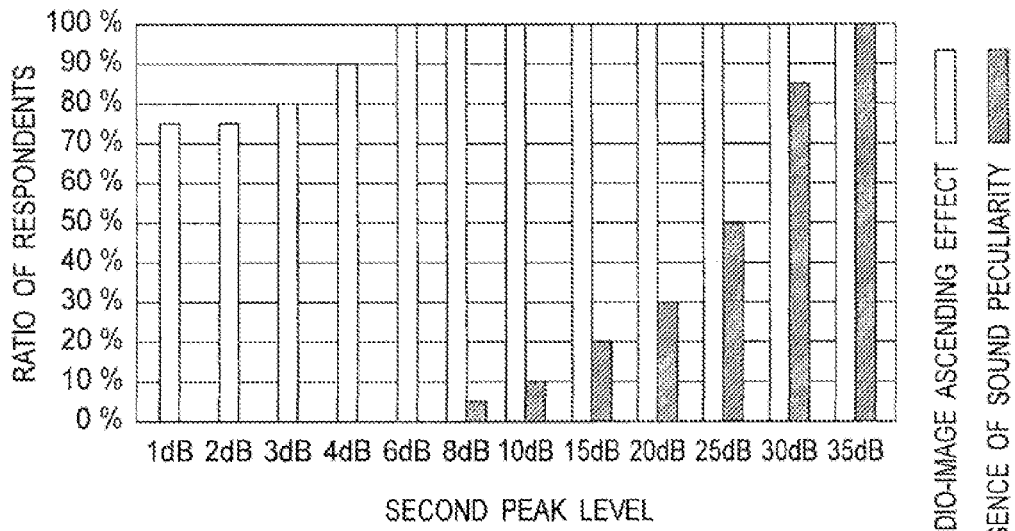
FIG. 11 is a graph of results of experiments about viewing illustrating an effect of the audio reproduction device according to the first embodiment of the present invention.

FIG. 11 is a graph illustrating the results of experiments about viewing, indicating an effect of the audio reproduction device according to the first embodiment. In the experiments about viewing, the center frequency of the first peak P1 was set to 6 kHz, the level thereof was set to 6 dB, and the Q value thereof was set to 7. Further, the center frequency of the second peak P2 was set to 13 KHz, and the Q value thereof was set to 4, while the peak level thereof was varied. In this way, similarly to the aforementioned experiments about viewing in FIG. 9 and FIG. 10, experiments were conducted on tested persons.

As can be clearly seen from the graph of FIG. 11, when the level of the second peak P2 was equal to or less than 2 dB, it was possible to provide only an audio-image ascending effect similar to that in the case where the level of the first peak P1 was 6 dB in the graph illustrated in FIG. 10, and there was observed no improvement of the effect provided by the formation of the second peak P2. When the level of the second peak P2 was 3 dB, 80% of the persons answered that there was an audio-image ascending effect, and an improvement of the audio-image ascending effect was recognized.

On the other hand, when the level of the second peak P2 was equal to or higher than 30 dB, all the tested persons recognized an audio-image ascending effect, and most of the tested persons felt peculiarities in sounds. When the level of the second peak P2 was equal to or higher than 8 dB but equal to or lower than 25 dB, only half or less of the persons answered that sounds had peculiarities. Further, as a result of the experiments about viewing, when the level of the second peak P2 was 6 dB, all the tested persons recognized an audio-image ascending effect, and no person felt peculiarities in sounds.

In the audio reproduction device according to the first embodiment of the present invention, in the sound-pressure frequency characteristic at 20 degrees in the vertically upward direction with respect to the center axes of the respective speakers 1a and 1c for the front L channel and the front R channel, the level of the first peak P1 is set to about 4 dB and the level of the second peak P2 is set to about 6 dB, and these levels are set to be slightly lower than the respective peak levels of the first peak P1 and the second peak P2 in reproduced sounds from the speaker 1b for the center channel. This is because the following facts are taken into account. That is, reproduced sounds from the respective front-channel speakers 1a and 1c contain larger numbers of signals of musical instruments and effective sounds which have wider frequency ranges than those of lines and vocals and, thus, have a tendency to contain sounds and voices having noticeable sound peculiarities.

On the other hand, reproduced sounds from the center-channel speaker 1b have a tendency to contain a larger number of lines and vocals. These sounds have lower levels in higher-frequency ranges in voice formant frequency spectra, in comparison with sounds of musical instruments and effective sounds and, therefore, particularly, even if the level of the second peak p2 is made higher, the sounds do not become sounds which are hard to hear, which enable viewers to hear them without having an uncomfortable feeling.

The frequency of the first peak P1 in the sound-pressure frequency characteristic of reproduced sounds from the speakers ranges from 5 kHz to 7 kHz, due to differences in head-related transfer function among individual persons, as can be seen from FIG. 8. As a result of actual experiments, it has been revealed that it is possible to provide an excellent audio-image ascending effect, by setting the center frequency of the first peak P1 within this range. Hereinafter, this audio-image ascending effect will be described with reference to FIG. 12.

Figure 12:
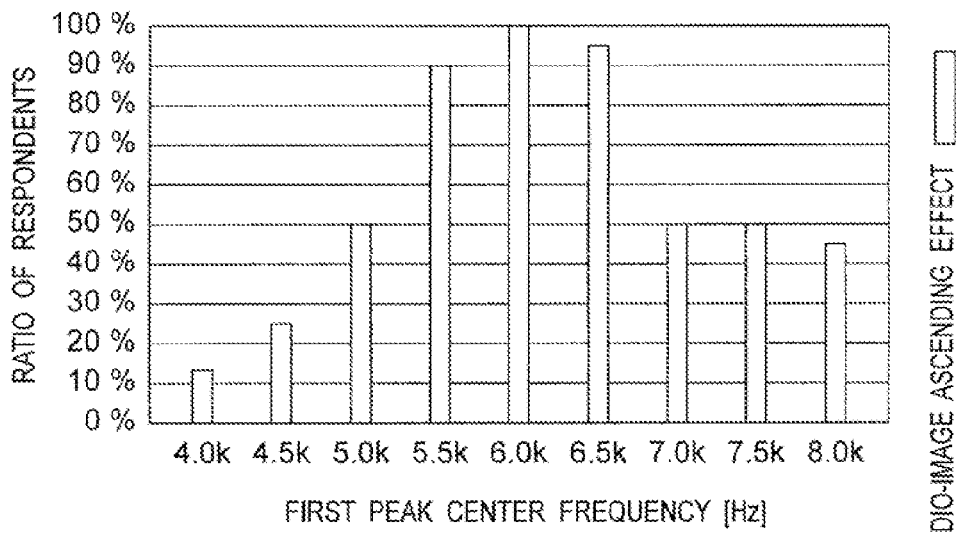
FIG. 12 is a graph of results of experiments about viewing illustrating an effect of the audio reproduction device according to the first embodiment of the present invention.

FIG. 12 is a graph illustrating the results of experiments about viewing, which were conducted on viewers in order to verify the effect of the audio reproduction device according to the first embodiment of the present invention. As these experiments about viewing, experiments about viewing similar to the experiments about viewing illustrated in FIG. 9 and FIG. 10 were conducted, while the center frequency of the first peak P1 was varied. Namely, the aforementioned 20 tested persons were caused to evaluate the audio-image ascending effect, by setting the level and the Q value of the first peak P1 to 6 dB and 7 and by setting the center frequency, respectively, the level and the Q value of the second peak P2 to 13 kHz, 10 dB and 4, while varying the center frequency of the first peak P1.

As can be clearly seen from the graph illustrated in FIG. 12, in the case where the center frequency of the first peak P1 was 5.5 kHz, 6.0 kHz and 6.5 kHz, particularly, a large number of persons answered that audio images were ascended. In the case where the center frequency of the first peak P1 was 5.0 kHz and in the case where it was 7.0 kHz, about half of the persons felt an audio-image ascending effect, and there were differences therein among individual persons. In the case where the center frequency of the first peak P1 was 4.5 kHz and 4.0 kHz, a largely-reduced number of persons felt an audio-image ascending effect, and a large number of persons answered that they could oppositely notice that the sounds were generated from the speakers under the screen. According to the aforementioned facts, it is possible to offer an audio-image ascending effect by setting the center frequency of the first peak P1 within the range of at least 5 kHz to 7 kHz, and it is particularly preferable to set the center frequency of the first peak P1 within the range of 5.5 kHz to 6.5 kHz, which can offer an excellent audio-image ascending effect. Namely, it is preferable to set the center frequency of the first peak P1 at 6 kHz±15%, as an indication.

The frequency of the second peak P2 in the sound-pressure frequency characteristic of reproduced sounds from the speakers ranges from 10 kHz to 16 kHz, due to differences in head-related transfer function among individual persons, as can be seen from FIG. 8. As a result of actual experiments, it has been revealed that it is possible to provide an excellent audio-image ascending effect, by setting the center frequency of the second peak P2 within this range. Hereinafter, this audio-image ascending effect will be described with reference to FIG. 13.

Figure 13:
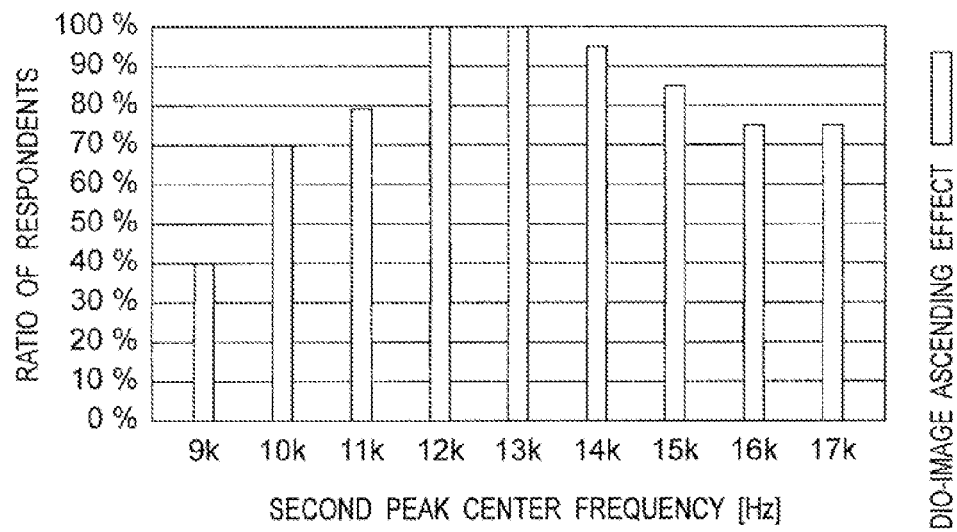
FIG. 13 is a graph of results of experiments about viewing illustrating an effect of the audio reproduction device according to the first embodiment of the present invention.

FIG. 13 is a graph illustrating the results of experiments about viewing, which were conducted on viewers in order to verify the effect of the audio reproduction device according to the first embodiment of the present invention. As these experiments about viewing, experiments about viewing similar to the experiments about viewing illustrated in FIG. 9 and FIG. 10 were conducted, while the center frequency of the second peak P2 was varied. Namely, the aforementioned 20 tested persons were caused to evaluate the audio-image ascending effect, by setting the center frequency, the level and the Q value of the first peak P1 to 6 kHz, 6 dB, and 7, respectively and by setting the level and the Q value of the second peak P2 to 10 dB and 4, respectively while varying the center frequency of the second peak P2.

As can be clearly seen from the graph illustrated in FIG. 13, in the case where the center frequency of the second peak P2 was 12 kHz, 13 kHz and 14 kHz, particularly, a large number of persons answered that audio images were ascended. By comparing the graph of FIG. 13 with the case where the level of the first peak P1 was 6 dB in the graph of FIG. 10, when the center frequency of the second peak P2 was equal to or higher than 16 kHz, only about 75% of the persons answered that there was an audio-image ascending effect, regardless of the provision of the second peak P2, which indicates that there was no improvement. This is considered to be caused by the fact that the frequency was extremely higher and was difficult to hear, and, therefore, these cases were not different from cases where there was no second peak P2. However, when the center frequency of the second peak P2 was 15 kHz, a slightly-increased number of persons answered that there was an audio-image ascending effect and, therefore, it is considered that there was attained an improvement.

Further, by comparing the graph of FIG. 13 with the case where the level of the first peak P1 was 6 dB in the graph of FIG. 10, when the center frequency of the second peak P2 was 10 kHz, 70% of the persons answered that there was an audio-image ascending effect, which indicates that the provision of the second peak P2 offered an adverse effect. Further, when the center frequency of the second peak P2 was 9 kHz, the number of persons who answered that there was an audio-image ascending effect was reduced to half or less (40%). Further, when the center frequency of the second peak P2 was 9 kHz, a few persons answered that they could oppositely notice that the sounds were generated from the speakers under the screen and, furthermore, there were peculiarities in the sounds. However, when the center frequency of the second peak P2 was 11 kHz, almost 80% of the persons answered that there was an audio-image ascending effect and, therefore, it can be considered that there was attained an improvement in the audio-image ascending effect.

According to the aforementioned facts, it is possible to attain an improvement of the audio-image ascending effect with the provision of the second peak P2, by setting the center frequency of the second peak P2 within the range of at least 10 kHz to 16 kHz, and it is particularly preferable to set the center frequency of the second peak P2 within the range of 11 kHz to 15 kHz, which can offer an excellent audio-image ascending effect. Namely, it is preferable to set the center frequency of the second peak P2 at 13 kHz±20%, as an indication.

By further studying the frequency characteristic indicated by the audio-image ascending characteristic curve illustrated in FIG. 8, there is observed a prominent dip (recess) at a frequency of about 8 kHz, in addition to the first peak P1 and the second peak P2. Thus, the present inventors conducted experiments about viewing, by forming a dip having a center frequency of 8 kHz, a level of −5 dB and a Q value of 7, in the sound-pressure frequency characteristic of reproduced sounds which reached the ears of a viewer 6 existing at a position at 20 degrees in the vertically upward direction with respect to the center axis of each speaker 1a, 1b, 1c. As a result of the implementation of the experiments about viewing, it was found that there was a further audio-image ascending effect. By forming a dip within the range of at least from 7.5 kHz to 8.5 kHz in addition to a first peak P1 and a second peak P2 in the sound-pressure frequency characteristic of reproduced sounds from the audio reproduction device, there was observed an excellent audio-image ascending effect. Namely, it is preferable to set the center frequency of the dip at 8 kHz±10%, as an indication.

Accordingly, it can be understood that it is possible to exert an excellent audio-image ascending effect, by forming a first peak P1 within the range of at least 5 kHz to 7 kHz, a second peak P2 within the range of at least 10 kHz to 16 kHz, and a dip within the range of at least 7 kHz to 9 kHz.

Further, the audio reproduction device according to the first embodiment was structured in such a way as to make an attempt to ascend audio images from the sound source at a position at 20 degrees downwardly (−20 degrees) in the median plane to a position just in front of a viewer 6 (0 degree in the median plane), and the frequencies at the first peak P1, the second peak P2, and the dip were determined. By calculating the difference between the head-related transfer function at 0 degree in the median plane, which is disclosed in BLAUERT described in the aforementioned section of the background, and the head-related transfer function at 27 degrees downwardly in the median plane, and the difference between the head-related transfer function at 0 degree in the median plane and the head-related transfer function at 15 degrees downwardly in the median plane, there was observed the tendency of the frequency of the first peak P1 to slightly decrease in the case of the larger angle (the angle of dip of 27 degrees), but the respective frequencies of the first peak F1, the second peak P2, and the dip were not largely changed. Accordingly, it can be understood that, in cases of viewing at a position significantly close to the video reproduction device or even in cases of viewing at a position which is far therefrom to some degree, it is preferable to perform design, based on the indication (6 kHz±15%) of the frequency of the first peak P1, the indication (13 kHz±20%) of the frequency of the second peak P2, and the indication (8 kHz±5%) of the frequency of the dip, which have been described above.

As described above, with the audio reproduction device according to the first embodiment, a first peak P1 and a second peak P2 are provided in the sound-pressure frequency characteristic of reproduced sounds radiated to a viewing position, the center frequency of the first peak P1 is set to 6 kHz±15%, and the center frequency of the second peak P2 is set to 13 kHz±20%. Thus, it is possible to provide an excellent audio-image ascending effect which is not varied depending on individual persons, thereby making audio images and images coincident with each other, and further, it is possible to realize sounds having natural sound quality with reduced peculiarities. Further, with the audio reproduction device according to the first embodiment, the peak level of the first peak P1 is set within the range of from 3 dB to 12 dB, and the peak level of the second peak P2 is set within the range of from 3 dB to 25 dB, which can realize natural sound quality with less peculiarities. Further, by forming a dip (recess) having a center frequency of 8 kHz±10% in the sound-pressure frequency characteristic of reproduced sounds to be heard, it was possible to provide a further enhanced audio-image ascending effect.

Further, in the first embodiment, there has been described a case where each speaker 1a, 1b, is has a relatively-flat sound-pressure frequency characteristic, and a first peak P1 and a second peak P2 are formed by the frequency characteristic correction portions 2a, 2b, 2c, in the audio reproduction device according to the first embodiment. However, if the sound-pressure frequency characteristic of the speakers themselves is a characteristic having any one of a first peak P1 and a second peak P2, it is necessary only to form a single peak in the sound-pressure frequency characteristic of reproduced sounds by the frequency characteristic correction portions. This fact also applies to the dip to be formed in the sound-pressure frequency characteristic. Namely, provided that a first peak P1, a second peak P2 or a dip is contained in the sound-pressure frequency characteristic of the speakers themselves, it is possible to utilize the sound-pressure frequency characteristic of the speakers themselves, while forming a peak or a dip for compensating for the absent peak or dip by the frequency characteristic correction portions. Since the audio reproduction device according to the first embodiment of the present invention is structured as described above, it is possible to simplify the structure of the frequency characteristic correction portions, thereby suppressing the increase of the cost of the audio reproduction device.

While, in the audio reproduction device according to the first embodiment, the Q value of the first peak P1 is set to 7, and the Q value of the second peak P2 is set to 4, the present invention is not limited to these numerical values, and these Q values can be determined in consideration of the relationship between the audio-image ascending effect and sound peculiarities, in the present invention. Particularly, for the same peak level of the first peak P1, as the Q value increases, the sound peculiarities decrease, but the audio-image ascending effect tends to decrease. On the contrary, as the Q value decreases, the sound peculiarities increase, but the audio-image ascending effect tends to increase.

As a result of experiments about viewing, an appropriate Q value of the first peak P1 was about 7, and when the Q value was made excessively smaller, the sound peculiarities were increased. On the contrary, when the Q value was made excessively larger, the audio-image ascending effect was decreased. The obtained results indicated that a preferable Q value fell within the range of from 2 to 20. The Q value of the second peak P2 exerted, on the sound quality change, smaller influences than those of the Q value of the first peak P1 and, thus, such smaller influences were not noticeable for viewers. Therefore, the Q value of the second peak P2 was required only to be smaller than the Q value of the first peak and only to be equal to or more than 1.5.

Further, while in the audio reproduction device according to the first embodiment, the peak levels and the Q values of the first peak P1 and the second peak P2 are fixed to constant values, it is also possible to provide a structure capable of adjusting the peak levels and the Q values of the first peak P1 and the second peak P2 through the frequency characteristic correction portions 3a, 3b, 3c. For example, it is possible to make the audio-image ascending effect a higher priority than the sound naturalness by setting the peak levels to be higher or setting the Q values to be smaller, and it is possible to make the sound naturalness a higher priority than the audio-image ascending effect by setting the peak levels to be lower or by setting the Q values to be larger. As described above, when the peak levels and the Q values of the first peak P1 and the second peak P2 are adjustable, it is possible to adjust the audio-image ascending effect and the sound naturalness finely according to the source and the preference of the viewer.

Further, while there has been described a case where, in the audio reproduction device according to the first embodiment, the peak levels of the first peak P1 and the second peak P2 in the sound-pressure frequency characteristic of reproduced sounds radiated to a viewing position from the respective front-channel speakers 1a, 1c are set to be lower than those of the center-channel speaker 1b. However, it is also possible to perform design, such that the peak levels of the first peak P1 and the second peak P2 in the sound-pressure frequency characteristic of reproduced sounds from the respective front-channel speakers 1a, is are set to be the same as those of the center-channel speaker 1b. In cases where it is desired to make the audio-image ascending effect a higher priority than the sound naturalness and in other cases, it is preferable to perform design, such that the peak levels of the first peak P1 and the second peak P2 in the sound-pressure frequency characteristics of reproduced sounds from the respective speakers 1a, 1b, and 1c have the same values.

In the audio reproduction device according to the first embodiment, it is important to form a first peak P1 and a second peak P2 in the sound-pressure frequency characteristic of reproduced sounds radiated to a viewing position from each speaker 1a, 1b, 1c. Generally, even when the sound-pressure frequency characteristic at 0 degree on the center axes of the speakers is a characteristic which is flattened up to a higher-frequency range, its directivity is narrowed in higher-frequency ranges and, therefore, there is level attenuation in such higher-frequency ranges, regarding a direction toward the ears of the viewer existing above the speakers. Particularly, in cases where the speakers are full-range units as in the audio reproduction device according to the first embodiment, the directivity has a tendency to be narrowed in higher-frequency ranges. Accordingly, in such cases, it is preferable to set the levels of the peaks formed by the frequency characteristic correction portions to be higher, in consideration of the level attenuation caused by the directivity characteristic of the speakers in higher-frequency ranges.

For example, even when there is a first peak P1 having a level exceeding 12 dB in the sound-pressure frequency characteristic on the center axes of the speakers, if the sound pressure attenuates to make the level of the first peak P1 lower than 12 dB due to the directivity characteristic in the direction corresponding to the direction toward the viewer, the level of the first peak P1 is never excessively high, in the sound-pressure frequency characteristic on the center axes of the speakers. This fact about the first peak P1 also applies to the second peak P2.

Further, in the sound-pressure frequency characteristic of the reproduced sound from the speaker, when there is a dip in the sound-pressure frequency characteristic of the speakers themselves at a frequency corresponding to the first peak P1 or the second peak P2, it is necessary to provide a frequency characteristic correction portion for cancelling this dip and also for forming a peak level with a predetermined level.

There has been described a case where, in the audio reproduction device according to the first embodiment, the speakers 1a, 1b, 1c for the respective channels are constituted by full-range speakers having the same aperture. It goes without saying that the audio reproduction device according to the present invention is not limited to this structure, and a subwoofer can be added to each speaker 1a, 1b, 1c. Further, such a subwoofer can be either incorporated in the rack 1d or installed independently.

There has been described a case where, in the audio reproduction device according to the first embodiment, a first peak P1 and a second peak P2 are formed in the frequency characteristic by the frequency characteristic correction portions 3a, 3b, 3c. However, it goes without saying that it is also possible to form other peaks and other dips which are not directly related to the audio-image ascending, in order to correct the sound-pressure frequency characteristics of the speakers themselves.

In the audio reproduction device according to the first embodiment, it is desirable to determine and evaluate the sound-pressure frequency characteristic of reproduced sounds radiated to the viewing position, in an environment which induces substantially no reflection, such as in an anechoic room. If such determinations and evaluations are conducted in an environment which induces a number of reflections, this will induce increases of the sound-pressure level in middle-pitched and lower-pitched sound ranges as compared to those in higher-pitched sound ranges, thereby inducing a peak and a dip in the frequency characteristic.

Further, the audio reproduction device according to the present invention is not limited to the audio reproduction device having the exemplary structure described in the first embodiment, and the present invention is intended to cover any structures including the technical concepts described in the first embodiment.

Second Embodiment

Figure 14:
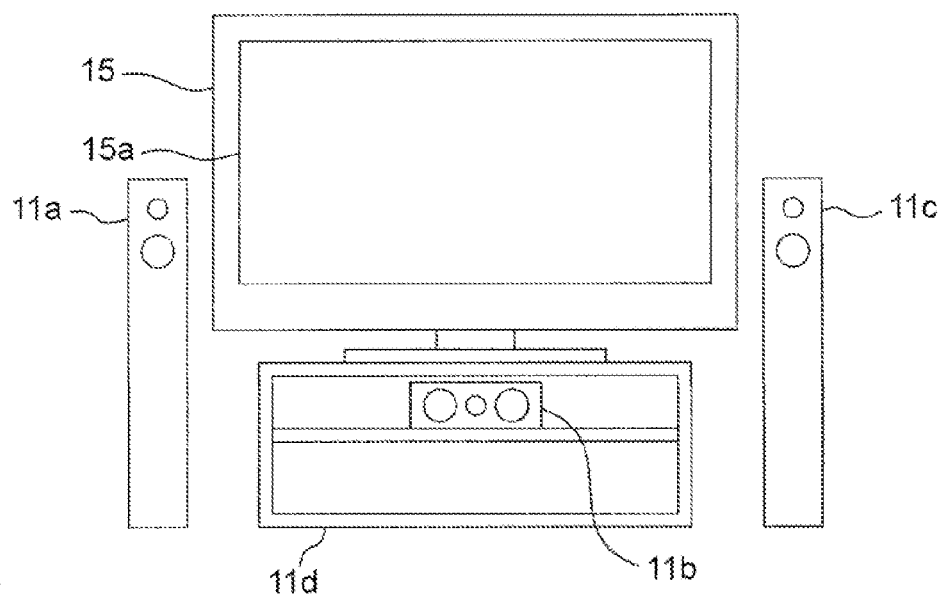
FIG. 14 is a front view illustrating a structure of an audio-video reproduction system including an audio reproduction device according to a second embodiment of the present invention.
Figure 15:
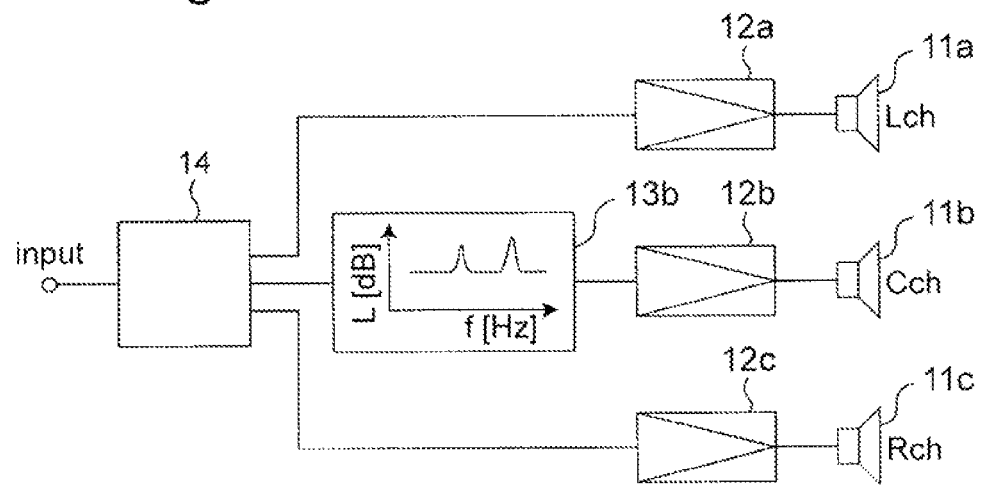
FIG. 15 is a block diagram illustrating a structure of the audio reproduction device according to the second embodiment of the present invention.

Next, an audio reproduction device according to a second embodiment of the present invention will be described, with reference to FIG. 14 and FIG. 15. FIG. 14 is a front view of an audio-video reproduction system employing the audio reproduction device according to the second embodiment in combination with a video reproduction device. FIG. 15 is a block diagram illustrating an internal structure of the audio reproduction device according to the second embodiment.

As illustrated in FIG. 14, in the audio-video reproduction system employing the audio reproduction device according to the second embodiment in combination with the video reproduction device, there is placed, on furniture 11d, a video reproduction device 15 having a thin-type large screen, such as a plasma television or a liquid crystal television. Inside the furniture 11d on which the video reproduction device 15 is placed, there is provided a speaker 11b for a center channel which includes a tweeter and woofers placed beside the tweeter at the opposite sides. Beside the furniture 11d at the opposite sides, there are placed front speakers 11a and 11b which are tallboy-type speakers.

The speaker 11a for the front L channel, the speaker 11b for the center channel, and the speaker 11c for the front R channel are single-piece speakers having a two-way structure including woofers with an aperture of 8 cm and a tweeter with an aperture of 2.5 cm and with a flat sound-pressure frequency characteristic and wide directivity. The respective speakers 11a, 11b, and 11c are placed to radiate sounds in the forward direction (in the direction in which the screen 15a faces) from positions below the horizontal line including the center of the screen 15a of the video reproduction device 15.

As illustrated in FIG. 15, the audio reproduction device according to the second embodiment includes amplifiers 12a, 12b, and 12c for driving the respective speakers 11a, 11b, and 11c, and a signal output device 14, similarly to the audio reproduction device according to the aforementioned first embodiment. However, in the audio reproduction device according to the second embodiment, the positions of audio images created by the respective speakers 11a and 11b for the front channels are closer to the center position of the screen 15a in the audio reproduction device 15 and, therefore, no frequency characteristic correction portions for the front channels are provided. Accordingly, in the audio reproduction device according to the second embodiment, there is provided only a frequency characteristic correction portion 13b for the center channel.

In the audio reproduction device according to the second embodiment, the amplifiers 12a, 12b, and 12c and the frequency characteristic correction portion 13b are structured to be housed in a single cabinet, and this cabinet is structured to be used by being placed at an arbitrary position without being secured to the furniture 11d. Further, the respective speakers 11a, 11b, and 11c are structured to be movable such that they can be placed at arbitrary positions. For example, the speaker 11b for the center channel can either be placed on an upper shelf in the furniture 11d as illustrated in FIG. 14 or be placed on a lower shelf. The furniture 11d is structured to be independent from the audio reproduction device according to the second embodiment, and the viewer can employ arbitrary furniture.

In the audio reproduction device according to the second embodiment, the frequency characteristic correction portion 13b for the center channel has a frequency characteristic having a first peak P1 with a center frequency of 5.5 kHz and a Q value of 8. Further, it is structured such that the level of the first peak P1 can be varied within the range of from 0 dB to 12 dB. For example, in cases where the speaker 11b for the center channel is placed on a lower shelf, it is possible to adjust the peak level to be higher for increasing the audio-image ascending effect, when it is used. On the other hand, there is a second peak P2 having a center frequency of 11.5 kHz, a level of 10 dB, and a Q value of 5.

Since the speaker 11b for the center channel has a flat sound-pressure frequency characteristic in higher-frequency ranges and wide directivity, reproduced sounds radiated to the viewing position therefrom have a sound-pressure frequency characteristic which is flattened in higher-frequency ranges. Further, the sound-pressure frequency characteristic of reproduced sounds radiated to the viewing position from the speaker 11b for the center channel has two peaks and thus has an audio-image ascending effect, similarly to the frequency characteristic of the frequency characteristic correction portion 13b.

As described above, with the audio reproduction device according to the second embodiment, it is possible to provide the same effects as those of the first embodiment and, further, it is possible to select the speakers according to viewer's preferences for sound quality. Further, the speaker 11b for the center channel can be placed at an arbitrary position in the furniture 11d, and the audio-image ascending effect can be freely adjusted according to the position where it is placed. As a matter of course, after fixing the position at which the speaker 11b for the center channel is placed, it is possible to freely adjust the balance between the audio-image ascending effect and the sound naturalness.

Further, in the audio reproduction device according to the second embodiment, the center frequency of the second peak P2 is set to 11.5 kHz, which is slightly lower. This is for providing a sufficient audio-image ascending effect for older people having lower ear sensitivity to higher frequencies; based on the assumption that main users are older people having strong preferences for single-piece speakers.

Further, the audio reproduction device according to the present invention is not limited to the audio reproduction device having the exemplary structure described in the second embodiment, and the present invention is intended to cover any structures including the technical concepts described in the second embodiment.

Third Embodiment

Figure 16:
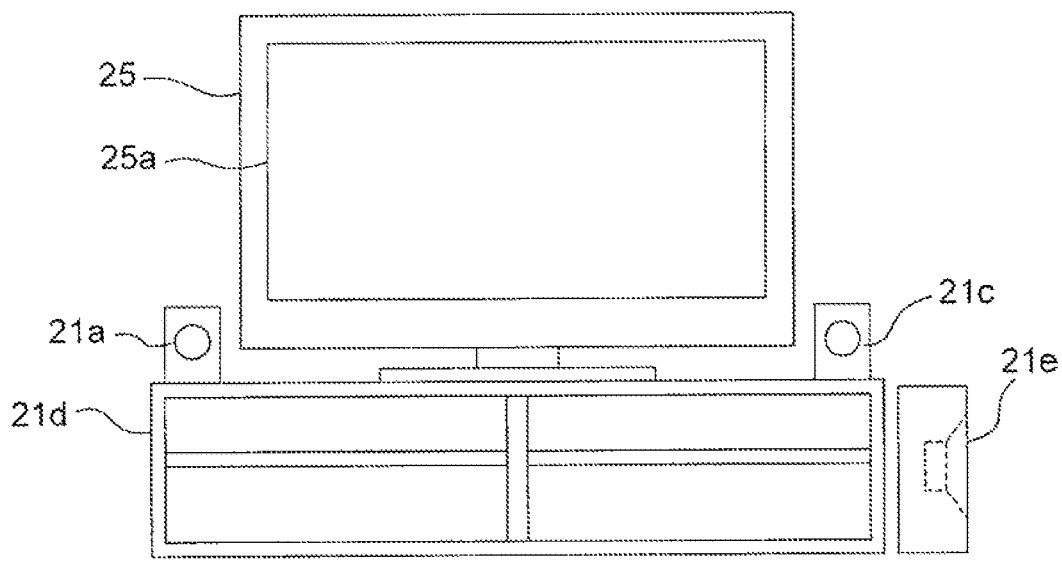
FIG. 16 is a front view illustrating a structure of an audio-video reproduction system including an audio reproduction device according to a third embodiment of the present invention.
Figure 17:
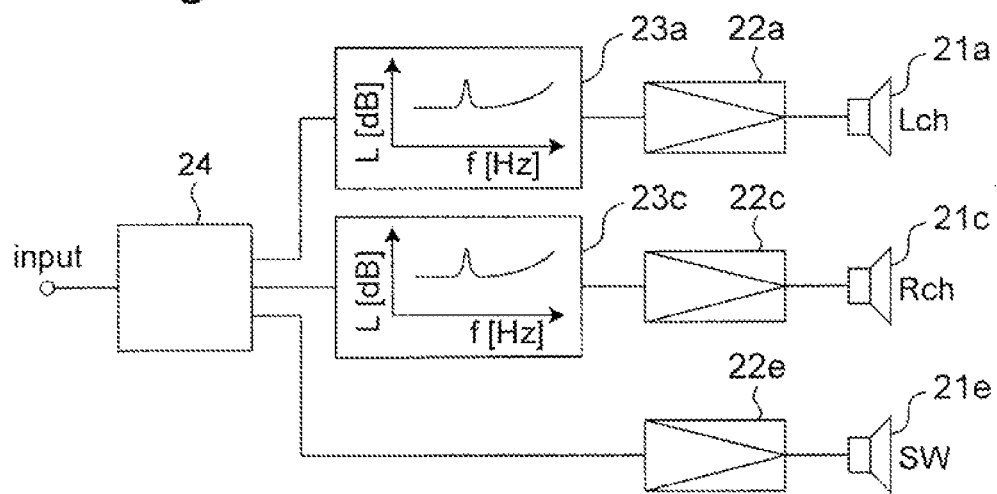
FIG. 17 is a block diagram illustrating a structure of the audio reproduction device according to the third embodiment of the present invention.
Figure 18:
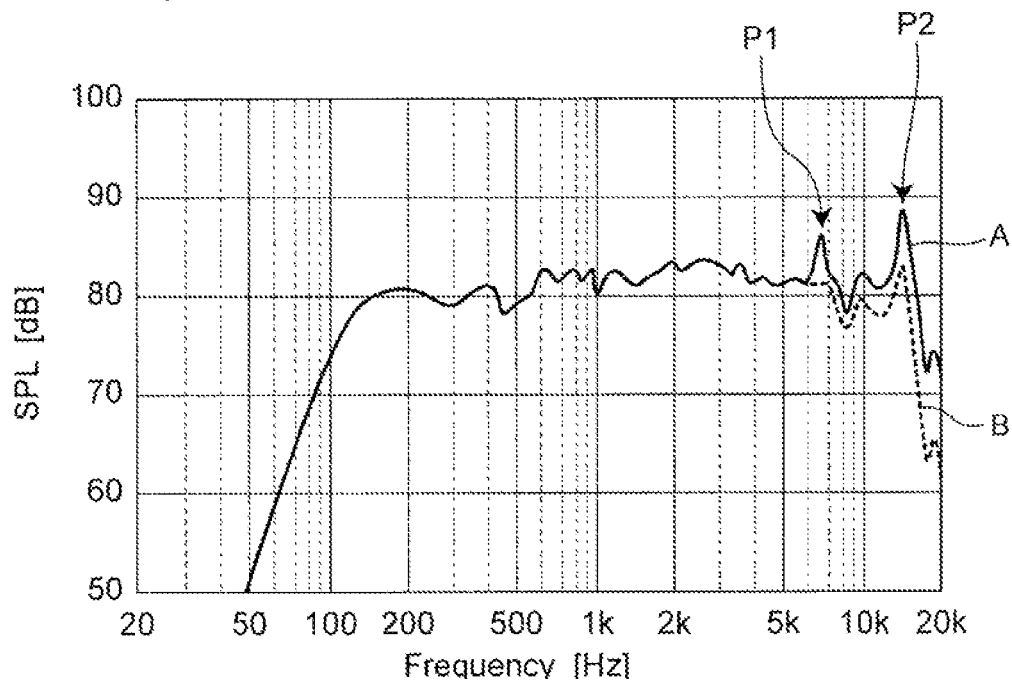
FIG. 18 is a sound-pressure frequency characteristic view of reproduced sounds heard at a position at 10 degrees in the vertically upward direction with respect to the center axis of a speaker for a front channel and at 30 degrees in the horizontal direction, in the audio reproduction device according to the third embodiment of the present invention.

Next, an audio reproduction device according to a third embodiment of the present invention will be described, with reference to FIGS. 16 to 18. FIG. 16 is a front view of an audio-video reproduction system employing the audio reproduction device according to the third embodiment in combination with a video reproduction device. FIG. 17 is a block diagram illustrating an internal structure of the audio reproduction device according to the third embodiment. FIG. 18 is a sound-pressure frequency characteristic view illustrating a sound-pressure frequency characteristic of radiation from the audio reproduction device according to the third embodiment, in a case where a viewer existed at 10 degrees in the upward direction with respect to the center axis of a front-channel speaker and performed viewing at a position at 30 degrees horizontally.

As illustrated in FIG. 16, in the audio-video reproduction system employing the audio reproduction device according to the third embodiment in combination with the video reproduction device, there is paced, on furniture 21d, a video reproduction device 25 having a thin-type large screen, such as a plasma television or a liquid crystal television. Further, on the furniture 21d, there are placed a speaker 21a for a front L channel and a speaker 21c for a front R channel. The speaker 21a for the front L channel and the speaker 21c for the front R channel are full range units having an aperture of 8 cm and are housed within a small-sized cabinet. The respective speakers 21a and 21c are structured to radiate sounds in the forward direction (in the direction in which the screen 25a faces) from positions below the horizontal line including the center of the screen 25a in the video reproduction device 25.

In the audio reproduction device according to the third embodiment, a subwoofer 21e is placed at a position outside a side surface of the furniture 21d (at the right side thereof in FIG. 16) and is placed on the floor surface. The subwoofer 21e is placed such that its center axis (the radiation axis) exists at a portion at which its center axis is rotated by 90 degrees horizontally with respect to the respective center axes of the speaker 21a for the front L channel and the speaker 21c for the front R channel. Namely, the subwoofer 21e is structured to radiate sounds in the direction which is rotated by 90 degrees horizontally with respect to the direction in which the screen 25a of the audio reproduction device 25 is faced.

As illustrated in FIG. 17, in the audio reproduction device according to the third embodiment, the speakers 21a and 21c for the respective front channels are driven by an amplifier 22a for the front L channel and an amplifier 22c for the front R channel, respectively. The subwoofer 21e is driven by an amplifier 22e dedicated for the subwoofer.

Frequency characteristic correction portions 23a and 23c for the respective front channels are connected to the amplifier 22a for the front L channel and the amplifier 22c for the front R channel, respectively, in the stages previous thereto. The frequency characteristic correction portions 23a and 23c are digital filter circuits using DSPs. Bit-stream digital signals from a source are decoded into signals for the front L channel, signals for the front R channel, and signals for the subwoofer by a signal output device 24, and the decoded signals are outputted therefrom. The signals for the front L channel and the signals for the front R channel which are outputted from the signal output device 24 are inputted to the frequency characteristic correction portions 23a and 23c, respectively. Further, the signal output device 24 performs so-called front virtual surround processing for forming a virtual surround sound field only with the respective front speakers 21a and 21c, as if a surround speaker was placed at a rear position.

Each frequency characteristic correction portion 23a, 23c creates a frequency characteristic provided with only a first peak P1 having a center frequency of 6.5 kHz. The first peak P1 has a level of 6 dB and a Q value of 5. Further, boosting of higher-frequency ranges is performed by a simplest first-order boost circuit, thereby realizing boosting by 3 dB at 10 kHz, by 6 dB at 14 kHz, and by 9 dB at 20 kHz.

FIG. 18 is a sound-pressure frequency characteristic view in a case where the viewer performed viewing at a position at 30 degrees horizontally and, also, at 10 degrees in the upward direction with respect to the center axes of the front-channel speakers 21a and 21c, in an anechoic room. Namely, FIG. 18 illustrates a sound-pressure frequency characteristic of reproduced sounds from the speakers 21a and 21c, in a case where the two front-channel speakers 21a and 21c and the viewer existed at the positions of the vertexes of a regular triangle shape and, also, the viewer performed viewing at a position at 10 degrees in the upward direction with respect to the center axes of the front-channel speakers 21a and 21c. In the graph illustrated in FIG. 18, a solid line A represents a sound-pressure frequency characteristic of reproduced sounds radiated from each speaker 21a, 21c to the viewing position, in the audio reproduction device provided with the frequency characteristic correction portions 23a and 23c. A broken line B represents a sound-pressure frequency characteristic of reproduced sounds radiated from each speaker 21a, 21c to the viewing position, in an audio reproduction device which is provided with no frequency characteristic correction portion. As can be seen from the broken line B, each of the speakers 21a and 21c employed in the audio reproduction device according to the third embodiment has its own sound-pressure frequency characteristic having a peak at a frequency of about 14 kHz, although its level is lower. In the sound-pressure frequency characteristic of the speakers 21a and 21c, a second peak is formed by raising the peak level to about 8 dB using the high-frequency-range boosting characteristic of the frequency characteristic correction portions 23a and 23c.

As described above, with the audio reproduction device according to the third embodiment, it is possible to provide the same effects as those of the first embodiment. Further, in the audio reproduction device according to the third embodiment, the frequency characteristic of the frequency characteristic correction portions 23a and 23b provides only a single peak and first-order high-frequency-range boosting, which enables simplification of the structure. This results in large reduction of the increase of the cost of the audio reproduction device according to the third embodiment.

Further, in the audio reproduction device according to the third embodiment, the second peak P2 is formed by utilizing the sound-pressure frequency characteristic of the speakers themselves. However, in cases where the sound-pressure frequency characteristics of the speakers themselves have one having a level corresponding to the first peak while having nothing having a level corresponding to the second peak, for example, it is possible to form a second peak by the frequency characteristic correction portions, while utilizing the first peak in the sound-pressure frequency characteristic of the speakers themselves.

Further, the audio reproduction device according to the present invention is not limited to the audio reproduction device having the exemplary structure described in the third embodiment, and the present invention is intended to cover any structures including the technical concepts described in the third embodiment.

Fourth Embodiment

Figure 19:
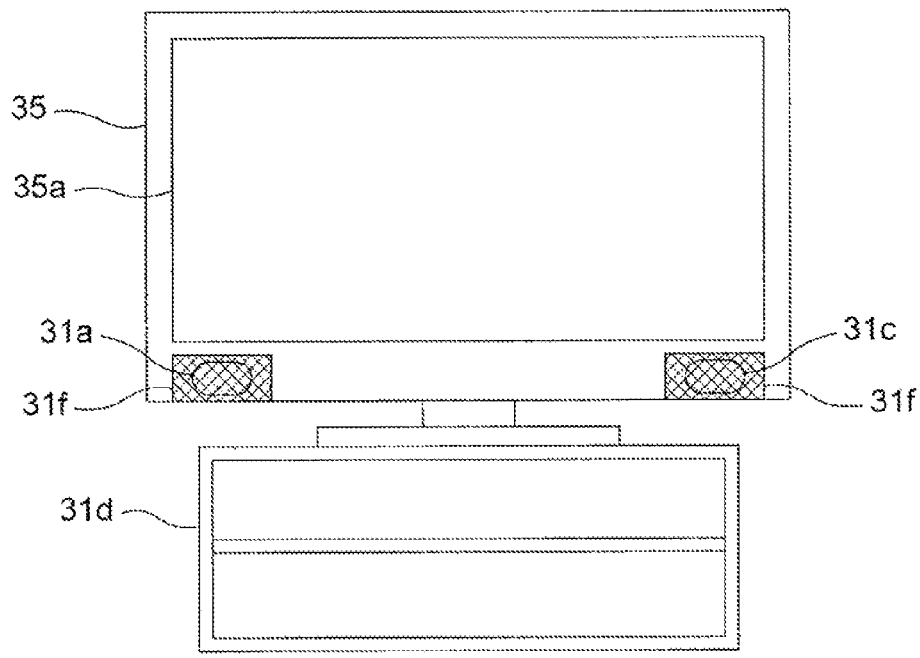
FIG. 19 is a front view illustrating a structure of an audio-video reproduction system including an audio reproduction device according to a fourth embodiment of the present invention.
Figure 20:
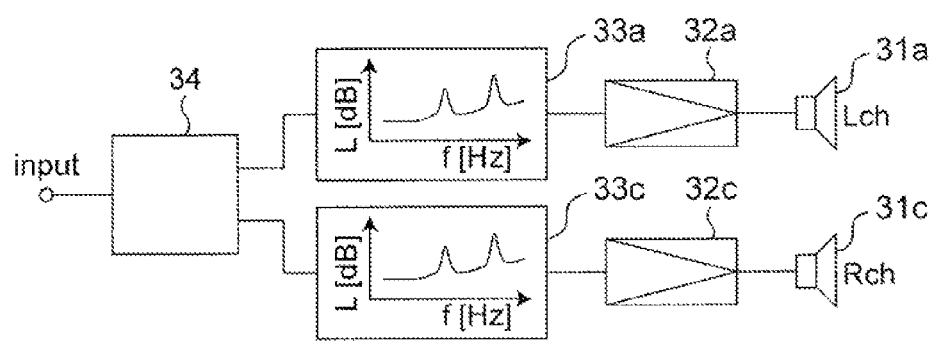
FIG. 20 is a block diagram illustrating a structure of the audio reproduction device according to the fourth embodiment of the present invention.
Figure 21:
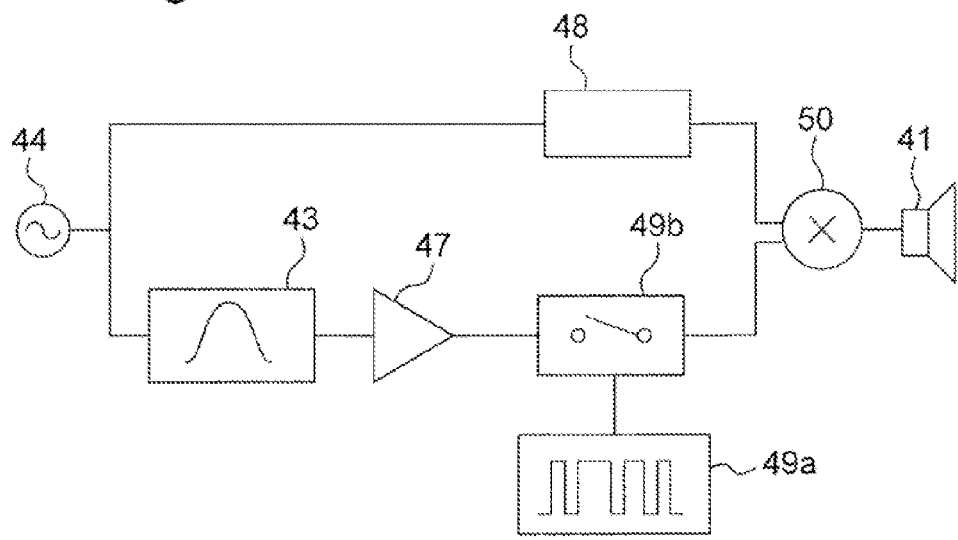
FIG. 21 is a block diagram illustrating a structure of a conventional audio reproduction device.
Figure 22:
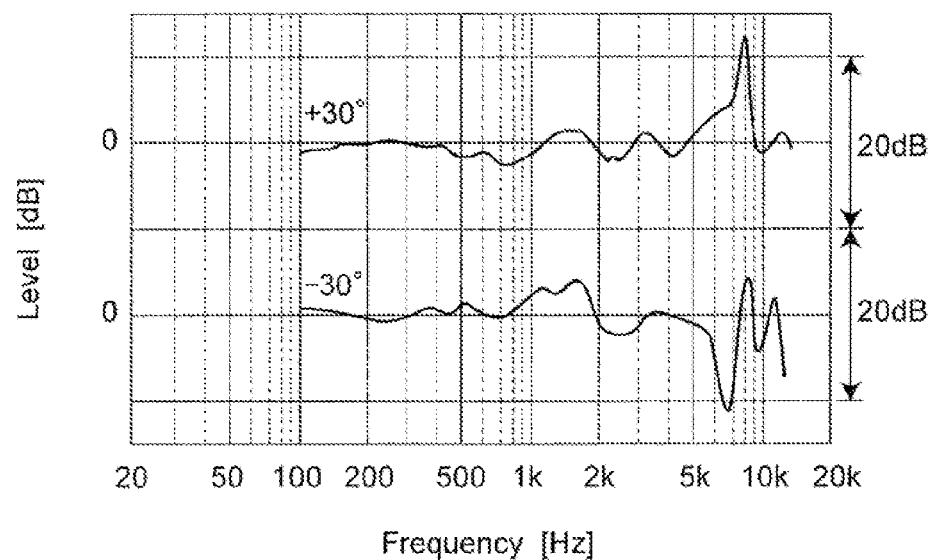
FIG. 22 is a sound-pressure frequency characteristic view of ear sensitivity to sounds reaching viewer's ears from sound sources existing at a position at 30 degrees upwardly in the median plane (+30 degrees) and at a position at 30 degrees downwardly in the median plane (−30 degrees), in the conventional audio reproduction device.
Figure 23:
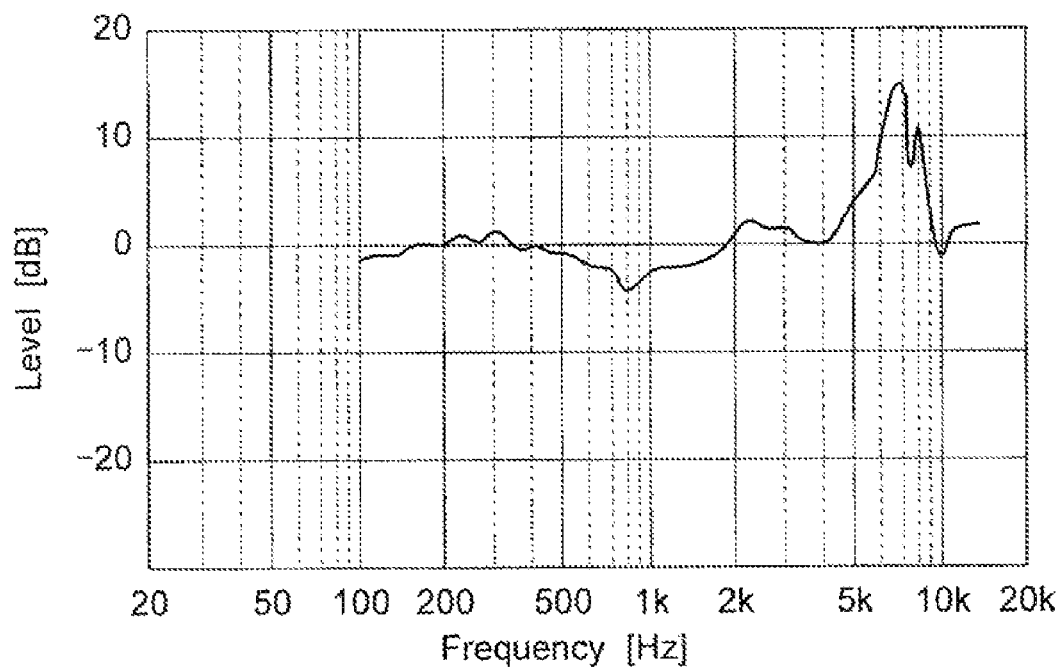
FIG. 23 is a sound-pressure frequency characteristic view resulted from the addition of an ear sensitivity characteristic at 30 degrees upwardly in the median plane (+30 degrees) to an opposite characteristic of the ear sensitivity characteristic at 30 degrees downwardly in the median plane (−30 degrees), in the conventional audio reproduction device.

Next, an audio reproduction device according to a fourth embodiment of the present invention will be described, with reference to FIG. 19 and FIG. 20. FIG. 19 is a front view of an audio-video reproduction system employing the audio reproduction device according to the fourth embodiment in combination with a video reproduction device. FIG. 20 is a block diagram illustrating an internal structure of the audio reproduction device according to the fourth embodiment.

As illustrated in FIG. 19, in the television receiver which is the audio-video reproduction system employing the audio reproduction device according to the fourth embodiment in combination with the video reproduction device, there is placed, on furniture 31d, a television receiver 35 having a thin-type large screen, such as a plasma television or a liquid crystal television. Inside the television receiver 35, there are provided a speaker 31a for an L channel and a speaker 31c for an R channel. Each speaker 31a, 31b is a full range unit having an elliptical shape and an aperture of 12 cm×6 cm. Each speaker 31a, 31b is covered at its front surface with a punched net 31f having a smaller aperture ratio. The respective speakers 31a and 31b provided in the television receiver 35 are placed to radiate sounds from below the screen 35a in the television receiver 35.

As illustrated in FIG. 20, in the audio reproduction device according to the fourth embodiment, the speakers 31a and 31c for the L channel and the R channel are driven by an amplifier 32a for the L channel and an amplifier 32c for the R channel, respectively. Frequency characteristic correction portions 33a and 33c are connected to the amplifier 32a and the amplifier 32c for the L channel and the R channel, respectively, in the stages previous thereto. Signals from a source are decoded into signals for the L channel and signals for the R channel by a signal output device 34, and the decoded signals are outputted therefrom. Signals for the L channel and signals for the R channel which are outputted from the signal output device 34 are inputted to the respective frequency characteristic correction portions 33a and 33c.

In the audio reproduction device according to the fourth embodiment, the frequency characteristic correction portions 33a and 33c perform boosting of the level in an entire higher-frequency range, in addition to forming a first peak P1 and a second peak P2 in the frequency characteristic. One reason thereof is that the punched net 31f covering the front surface of each speaker 31a, 31b has a lower aperture ratio, which induces attenuation in higher-frequency ranges in the frequency characteristic of reproduced sounds from each speaker 31a, 31b. Another reason thereof is that each speaker 31a, 31c has a laterally-longer elliptical shape and, therefore, has narrower directivity in higher frequency ranges in the horizontal direction, thereby inducing attenuation of the level in higher-frequency ranges at the viewing position. In order to compensate for the significant attenuations in such higher-frequency ranges due to the aforementioned reasons, the audio reproduction device according to the fourth embodiment is adapted to perform boosting of the level in entire high-frequency ranges.

In the audio reproduction device according to the fourth embodiment, the frequency characteristic formed by the frequency characteristic correction portions 33a and 33c has a first peak P1 having a center frequency of 6 kHz, wherein the peak itself has a level of 8 dB and a Q value of 10, and the height of the peak is 18 dB when viewed with respect to a level in a lower-pitched sound range. Further, there is a second peak P2 having a, center frequency of 12 kHz, and the peak itself has a level of 12 dB and a Q value of 5, and the height of the peak is 28 dB when viewed with respect to a level in a lower-pitched sound range. As a result, the sound-pressure frequency characteristic of reproduced sounds radiated to the viewing position has a first peak P1 having a level of 5 dB and a second peak P2 having a level of 8 dB.

As described above, with the audio reproduction device according to the fourth embodiment, it is possible to provide the same effects as those of the first embodiment and, further, it is possible to ascend audio images from the speakers themselves which are incorporated in the television receiver and also to provide natural sound quality with no peculiarities.

Further, the audio reproduction device according to the present invention is not limited to the audio reproduction device having the exemplary structure described in the fourth embodiment, and the present invention is intended to cover any structures including the technical concepts described in the fourth embodiment.

With the audio reproduction devices according to the present invention, it is possible to realize sounds having natural sound quality with less peculiarities, while providing an excellent audio-image ascending effect which is not varied due to differences among individual persons, thereby making audio images and images coincident with each other. Therefore, these audio reproduction devices according to the present invention are usable for audio reproduction in many devices, such as television-receiver audio reproduction devices, in-car audio reproduction devices, as well as ordinary 2-channel stereo audio reproduction devices, multi-channel audio reproduction devices. Thus, these audio reproduction devices have extremely high practical values.

The invention claimed is:

1. An audio reproduction device, comprising:
   a speaker that radiates sound from below a center of a screen in a video reproduction device;
   an amplifier that drives the speaker; and
   a frequency characteristic correction portion that outputs, to the amplifier, a signal having a corrected frequency characteristic,
   wherein the frequency characteristic correction portion forms a frequency characteristic such that a sound-pressure frequency characteristic of reproduced sound radiated to a viewing position from the speaker has a first peak and a second peak, and
   a center frequency of the first peak falls within a range of 5 kHz to 7 kHz, and a center frequency of the second peak falls within the range of 10 kHz to 16 kHz so that the video and sound are consistent with each other.

2. The audio reproduction device according to claim 1, wherein
   a level of the first peak falls within the range of from 3 dB to 12 dB, and a level of the second peak falls within the range of from 3 dB to 25 dB.

3. The audio reproduction device according to claim 1, wherein
   the first peak or the second peak is formed by utilizing a sound-pressure frequency characteristic of the speaker itself.

4. The audio reproduction device according to claim 1, wherein
   the sound-pressure frequency characteristic of reproduced sound radiated from the speaker has a characteristic curve having a dip formed to have a center frequency within range of 7 kHz to 9 kHz.

5. The audio reproduction device according to claim 4, wherein
   the dip is formed by utilizing a sound-pressure frequency characteristic of the speaker itself.

6. The audio reproduction device according to claim 1, wherein the audio reproduction device is adapted such that a level or a Q value of the first peak or the second peak is adjustable.

7. The audio reproduction device according to claim 1, wherein the frequency characteristic correction portion is structured to boost, by a predetermined level, a level in a higher-frequency range in the sound-pressure frequency characteristic of reproduced sound radiated to the viewing position from the speaker.

8. An audio-video reproduction system formed from the combination of the audio reproduction device according to claim 1, and
   a video reproduction device capable of reproducing images.

* * * * *